(12) United States Patent
Iri et al.

(10) Patent No.: US 7,211,526 B2
(45) Date of Patent: May 1, 2007

(54) LASER BASED SPLITTING METHOD, OBJECT TO BE SPLIT, AND SEMICONDUCTOR ELEMENT CHIP

(75) Inventors: Junichiro Iri, Kawasaki (JP); Genji Inada, Kawasaki (JP); Sadayuki Sugama, Tsukuba (JP); Masayuki Nishiwaki, Yoshikawa (JP); Hiroyuki Morimoto, Tsukuba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/058,163

(22) Filed: Feb. 16, 2005

(65) Prior Publication Data
US 2005/0199592 A1 Sep. 15, 2005

(30) Foreign Application Priority Data
Feb. 19, 2004 (JP) ............................. 2004-042718
Feb. 19, 2004 (JP) ............................. 2004-042731
Nov. 19, 2004 (JP) ............................. 2004-335289

(51) Int. Cl.
*H01L 21/36* (2006.01)
(52) U.S. Cl. .................. 438/797; 438/463; 438/106; 438/113; 438/667; 438/584; 438/462; 219/121.67; 219/121.72; 257/620
(58) Field of Classification Search ................ 438/463, 438/106; 219/121.72
See application file for complete search history.

(56) References Cited
U.S. PATENT DOCUMENTS
6,744,009 B1 * 6/2004 Xuan et al. ............ 219/121.67

6,856,023 B2 2/2005 Muta et al. ................. 257/774
6,992,026 B2 * 1/2006 Fukuyo et al. .............. 438/797
2004/0002199 A1 1/2004 Fukuyo et al. .............. 438/460

FOREIGN PATENT DOCUMENTS

| JP | 2002-192370 | 7/2002 |
| JP | 2002-205180 | 7/2002 |
| JP | 2003-334675 | 11/2003 |
| WO | WO 03/076119 | 9/2003 |

\* cited by examiner

*Primary Examiner*—Evan Pert
*Assistant Examiner*—Fazli Erdem
(74) *Attorney, Agent, or Firm*—Fitzpatrick, Cella, Harper & Scinto

(57) ABSTRACT

A laser splitting method for splitting off a segment from an object to be split using a laser beam, includes a surface processing step of processing the object by forming a linear recessed portion in a surface of the object, the linear recessed portion being effective to cause a stress concentration at the surface of the object; an internal processed-region forming step of forming an internal processed-regions at a depth of the object in a line along which a laser beam scans the surface of the object by a relative motion therebetween, the laser beam being converged adjacent the depth, wherein the thus formed internal processed-regions extend in a direction substantially perpendicular to the surface of the object; and an external force applying step of applying an external force to the object to form cracks between the recessed portion and the internal processed-regions.

6 Claims, 31 Drawing Sheets

(a)

(b)

(a)

(b)

(c)

(d)

(a)

(b)

BEFORE FRACTURE (AFTER FORMATION OF INTERNAL CRACKS)

FRACTURE ↓

SEPARATION ↓

(a)

(b)

(a)

(b)

(c)

(a)

(b)

(a)

(b)

(A-A)

(c)

(B-B)

(a)

(b)

(a)

(b)

LASER BASED SPLITTING METHOD, OBJECT TO BE SPLIT, AND SEMICONDUCTOR ELEMENT CHIP

FIELD OF THE INVENTION AND RELATED ART

The present invention relates to a method for splitting an object by causing a beam of laser light to converge on the object to be split. It also relates to an object across which a plurality of semiconductor element circuits (a plurality of semiconductor chips) are present, and which is slit with the use of the laser based splitting method, and the semiconductor element chips.

As for the method, in accordance with the prior art, for splitting an object, the blade dicing method has been known, according to which a blade in the form of a disc, the thickness of which is in the range of several tens of micrometers—hundreds of micrometers is rotated at a high speed, and a piece of semiconductor substrate (which hereinafter may be referred to as workpiece) is separated into a plurality of pieces as the substrate is cut by the abrasive substances on the surface of the blade. In the case of this method, it has been a common practice to jet a stream of water as coolant at the point at which the substrate is cut, in order to reduce the amount of heat resulting from the cutting, and/or to reduce the amount of frictional wear. Jetting a stream of water at the cutting point, however, has the following problem: The minute particles of the workpiece itself and the abrasives, which result from the cutting, mix into the cooling water, and are scattered across the wide area including the surfaces which have just been created by the cutting. In particular, when precisely cutting a substrate, such as a piece of silicon wafer, across which a plurality of semiconductor circuits have been formed to form semiconductor elements, into a plurality of chips, the minute particles of the substrate and abrasives, which result from the cutting, particles of the adhesive tape used for firmly holding the substrate to a processing table, and the like particles, mix into the cooling water, and are scattered across the wide area inclusive of the surface across which the semiconductor circuits have been formed.

In order to solve this problem, it is desired to cut an object in a dry environment, that is, without using cooling water. As one of the methods for cutting an object without using cooling water, the method for cutting the substrate by making a beam of such laser light that is higher in the rate of absorption, that is, laser light longer in wavelength, to converge on the surface of the substrate, has been known. This method, however, melts the adjacencies of the point at which the substrate is cut, along with the targeted point; in other words, the adjacencies of the cutting line are damaged. In particular, when an object to be cut is a piece of semiconductor substrate, there is the problem that the semiconductor circuits on the substrate are damaged across the areas near the cutting lines. There is also the following problem. That is, when a semiconductor substrate is cut with the use of a laser based cutting device, the melting of the substrate progresses from the surface of the substrate, on the side from which the beam of laser light is caused to converge upon the substrate, to the opposite surface of the substrate. Therefore, the products which result as the melted substances (substrate, etc.) re-solidify adhere to the surface of the substrate, adversely affecting the normal operations of the semiconductor circuits such as logic circuits.

As one of the solutions to the above described problem, the method for cutting the substrate by causing a beam of laser light with a high rate of absorption to converge so that the point of convergence will be in the middle of the substrate in terms of the thickness direction of the substrate has been known. For example, according to the method disclosed in Japanese Laid-open Patent Application 2002-192370, or 2002-205180, a beam of laser light with a specific wavelength, which is capable of penetrating at a proper ratio the substrate, as an object to be cut, is made to converge upon the substrate so that the point of convergence, that is, the point at which the cutting begins, will be in the middle of the substrate in terms of the thickness direction of the substrate. With the use of this method, the substrate is not melted at the surface. Therefore, this method is thought to be capable of eliminating the effects of the above described heat and re-solidification.

Further, the aforementioned Japanese Laid-open Patent Application 2002-205180 discloses a method for providing a plurality of points, in terms of the direction in which the beam of laser light is projected, at which the properties of the substrate can be modified, by adjusting the depth, in terms of the thickness direction of the substrate, at which the beam of laser light converges.

According to the method disclosed in this publication, however, the point where the cutting starts is limited to the area of the substrate where the substrate properties are modified. Therefore, it is difficult to control the direction and location in which a crack develops toward the substrate surfaces from the point at which the cutting begins, and therefore, it is difficult to cause a crack to develop only in the proper direction and position.

In particular, in the case of an object to be processed (object to be cut), such as a silicon wafer, that has a crystalline structure, the direction in which cracks progress is affected by the crystal orientation of the substance of which the object is formed. Therefore, if the laser based cutting method disclosed in the abovementioned publication is used to split such an object as the silicon substrate having a minute deviation between the intended splitting line and the crystal orientation of the substrate at the substrate surface, due to the manufacturing errors or the like, which occur during the formation of the silicon substrate and the elements thereon, the crack will miss the intended splitting line as it develops toward the substrate surface. Therefore, it is highly possible that the logic circuits or the like of the semiconductor elements on the substrate will be destroyed.

To describe in more detail with reference to a silicon substrate, referring to FIG. 38(a), when an internal area 102 is processed by making a beam L of laser light with a specific wavelength converge in a silicon substrate 101, that is, a silicon wafer which is formed of a single crystal of silicon and the surface crystal orientation of which is (100), so that it converges at a predetermined depth from the surface of the substrate, the crack 103a which starts at the point 102a of the process portion 102, that is, the point of the process portion 102 on the top surface side, sometimes reaches the top surface, splitting thereby the substrate. In such a case, there will have been formed a crystal orientation plane of higher value at the point 102a at which the processing by laser was started. Therefore, the crack does not follow the ideal line 103; it follows the line 103a. That is, it tilts in the direction parallel to the plane (110) or (111) as the cleavage plane. FIG. 38(b) schematically shows a substrate, the top surface of which is parallel to the crystal-line orientation plane of (100), and the cleavage plane is parallel to the crystalline orientation plane (111). In this case, the top surface of the silicon substrate 101 is going to be split along the line which is substantially deviated from the intended line. Further, if the portion 102, across which the silicon substrate 101 is processed, is deep inside the substrate 101, the distance between the process starting point 102a and the top surface of the substrate 101 becomes substantial. Therefore, the substrate 101 sometimes fails to be split into a plurality of semiconductor chips.

Further, the portion of the crack, which is closer to the top surface of the silicon substrate 101, that is, the important surface for the formation of the semiconductor elements, is affected by the state of the silicon crystal of which the substrate 101 is formed. Therefore, if crystalline defects or the like happen to be present between the top surface of the substrate 101 and the processed portion 101 immediately inward of the top surface, there occur sometime such cracks that are detrimental to the structural components on the top surface of the substrate 101. Moreover, if unwanted cracks happen to occur, it is impossible to artificially prevent the cracks from growing, and therefore, the circuits on the top surface of the substrate 101 are sometimes damaged.

In particular, in the case of a substrate for manufacturing a liquid ejection head, across which a plurality of liquid ejection orifices have been formed, there are a large number of tubular structures for supplying liquid such as ink, below the openings of the liquid ejection orifices. Therefore, there is the possibility that unwanted cracks will develop from the processed portion 102, progress to the above mentioned internal tubular structures, and destroy the substrate. This possibility is greater when the thickness of the substrate is substantial compared to the size (length) of the internal portion of the substrate across which the substrate is processed (length of internal crack).

It occurs sometimes that while an object is processed with the use of a laser based device, the cracks resulting from the processing of the object split the object by progressing to the surface of the object. In such a case, the object being processed sometimes moves, making it impossible thereafter to precisely trace the intended splitting line with a beam of laser light.

This problem is one of the most important problems which must be solved for the following reason. That is, from the standpoint of the conveyance and handling of the substrate during the period from the step in which the beam of laser light is made to converge to the substrate to the step in which the chips are actually separated from the substrate, in addition to the standpoint of precisely holding the substrate to precisely splitting the substrate, when separating from the silicon substrate a large number of semiconductor chips formed on the surface of the silicon substrate, it is more convenient for each chip to remain attached to the substrate until the step in which the chips are actually separated from the substrate begins.

SUMMARY OF THE INVENTION

The primary object of the present invention is to provide a laser based splitting method capable of ensuring that the cracks which will develop from the internal portion of an object to be split, which has been processed by making a beam of laser light converge to a given point of the internal portion of the object, will be accurately guided to the intended splitting line on the surface of the object, in order to drastically improve the levels of efficiency, safety, and reliability, with which the object is split, and also, to provide an object to be split, and semiconductor chips, which are preferable for accomplishing the above described object of the present invention.

According to an aspect of the present invention, there is provided a laser splitting method for splitting off a segment from an object to be split using a laser beam, said method comprising a surface processing step of processing the object by forming a linear recessed portion in a surface of the object, the linear recessed portion being effective to cause a stress concentration at the surface of the object; an internal processed-region forming step of forming an internal processed-regions at a depth of the object in a line along which a laser beam scans the surface of the object by a relative motion therebetween, the laser beam being converged adjacent the depth, wherein the thus formed internal processed-regions extend in a direction substantially perpendicular to the surface of the object; and an external force applying step of applying an external force to the object to form cracks between the recessed portion and the internal processed-regions.

More particularly, the present provides a laser based splitting method for splitting an object to be split, into a plurality of smaller individual pieces, which is characterized in that it comprises: a surface processing step in which recesses are formed in the surface of the object to make stress to concentrate to the surface of the object; an internally processing step in which a beam of laser light is made to converge to a single or plurality of points in the object, located at predetermined depths from the surface of the object, in order to form a plurality of processed portions which extend from the points of light convergence in the direction intersectional to the surface of the object, and also, in which the beam of laser light and the surface of the object are moved relative to each other in the direction parallel to the surface of the object, in order to form, below the surface of the object, groups of processed portions aligned in parallel in the direction parallel to the surface of the object; and a crack forming step in which a crack is formed between each of the abovementioned recesses and the corresponding processed portion, by applying external force to the object.

According to another aspect of the present invention, there is provided an object to be split on which a plurality of circuits each including a semiconductor element are formed, said object comprising a recess formed in a surface of said object; internal processed-regions formed inside said object by application of a laser beam which converges at a depth of said object, wherein the object is split by connecting said recess and said internal processed-regions into a plurality of element chips each having the semiconductor element.

More particularly, the present invention provides an object to be split, across which a plurality of semiconductor circuits are formed, characterized in that it comprises: recesses formed in its surface; processed portions formed in the object by making a beam of laser light to converge in the object, and that it can be split into a plurality of individual element chips having a semiconductor element, by developing a crack between each of the abovementioned recesses and the corresponding processed portion.

According to a further aspect of the present invention, there is provided a semiconductor element chip provided by fracturing and splitting off from an object to be split which has a plurality of semiconductor element circuits on a surface thereof, a recess formed on the surface and internal processed-regions formed by converging a laser beam, wherein said object has a crystalline structure, said semiconductor element chip comprising a side surface provided by the splitting; and a portion having constituted at least a part of the recess; a molten and solidified portion having constituted a part of said internal processed-regions; and a cleavage surface having constituted a crack between said recess and said internal processed-regions.

More particularly, the present invention provides a plurality of individual semiconductor chips yielded by forming recesses in the surface of an object across which a plurality of semiconductor element circuits have been formed, forming processed portions in the object, by causing a beam of laser light to converge in the object, and splitting thereafter the object, characterized in that the lateral surfaces of each element chip yielded by splitting the object comprise at least a portion of one of the internal surfaces of the recess, one of the surfaces of the processed portion, and one of the surfaces of the crack developed between the recess and corresponding processed portion.

These and other objects, features, and advantages of the present invention will become more apparent upon consideration of the following description of the preferred embodiments of the present invention, taken in conjunction with the accompanying drawings.

DESCRIPTION OF THE PREFERRED EMBODIMENTS

Hereinafter, the preferred embodiments of the present invention related to the method of splitting a silicon substrate 10 by fracturing, across which a plurality of logic elements 10a as semiconductor elements have been formed, into a plurality of individual element chips, will be described.

In the following embodiments of the present invention, of the two primary surfaces of a substrate, the surface across which a plurality of semiconductor circuits are formed will be referred to as the top surface, and the opposite surface from the top surface will be referred to as the bottom surface. Thus, when one of the primary surfaces of a substrate is referred to simply as the substrate surface, it may be the top surface or the bottom surface. Therefore, when an object to be split is such an object for which it is irreverent whether it is to be split from the top side or the bottom side, both of the primary external surfaces of the object will be referred to simply as the surface of the object.

Figure 1:
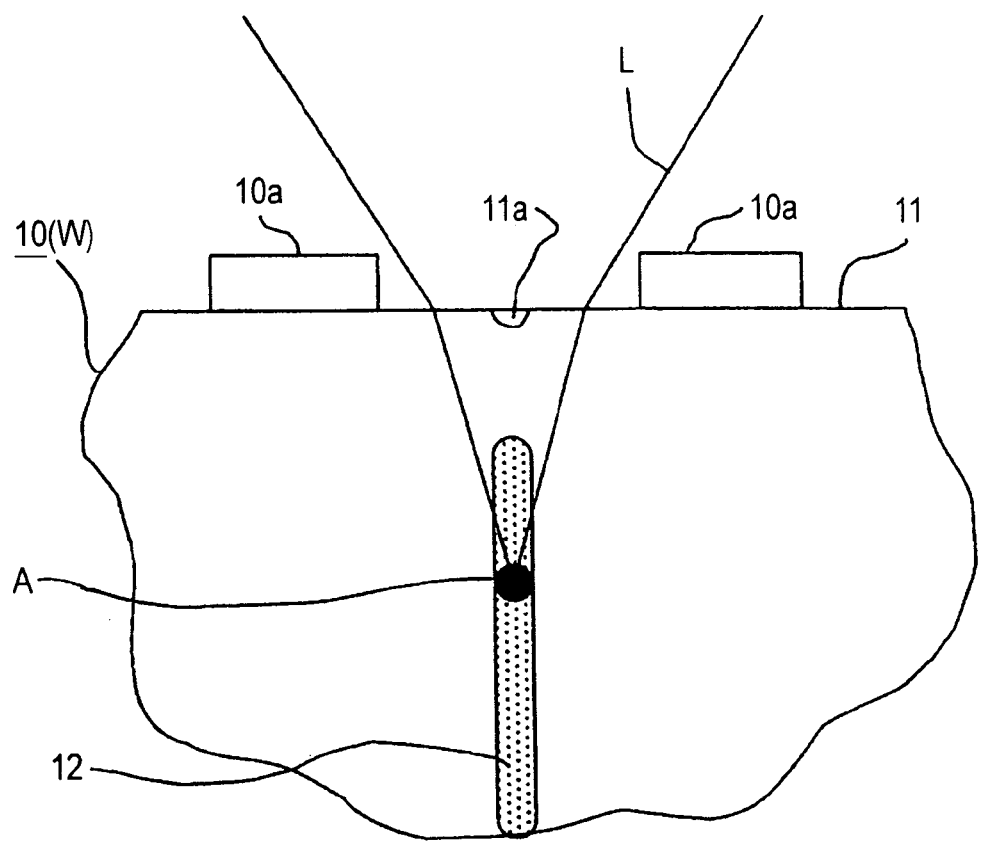
FIG. 1 is a schematic drawing for depicting the direction in which the crack progresses in the first embodiment.
Figure 2:
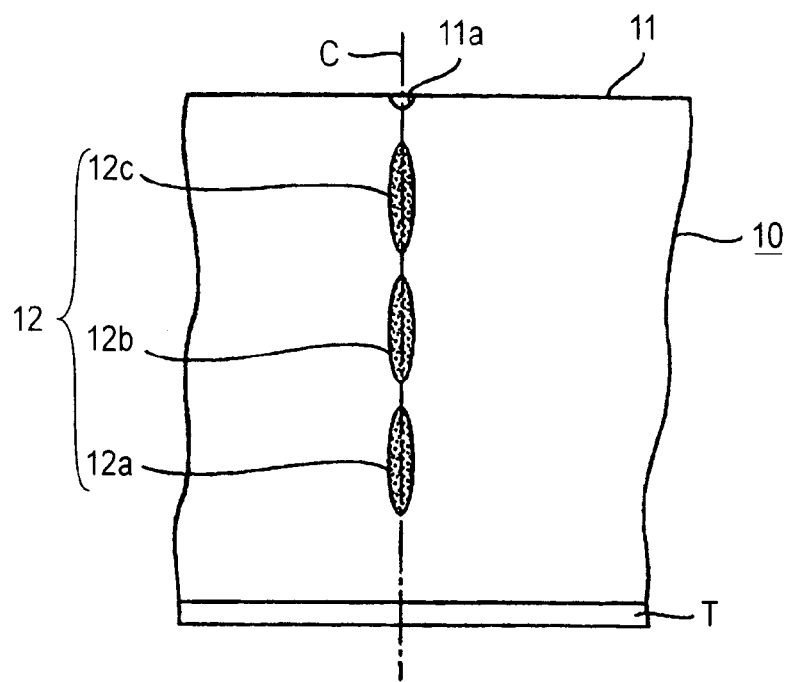
FIG. 2 is a schematic drawing for describing the first embodiment of the present invention.

Referring to FIGS. 1 and 2, an internal portion of the substrate 10 is processed by causing a beam of laser light L to converge to an internal point A of the silicon substrate 10, which has a predetermined distance from the top surface of the silicon substrate 10, so that the processed portion does not reach the top surface 11 of the substrate. Here, processing a given portion of the substrate 10 means changing the crystalline structure of the portion, softening the portion, melting the portion, creating cracks in the area, and/or the like. In this embodiment, creating cracks in a given portion of the silicon substrate 10 is essential as the internal processing of the silicon substrate.

Figure 3:
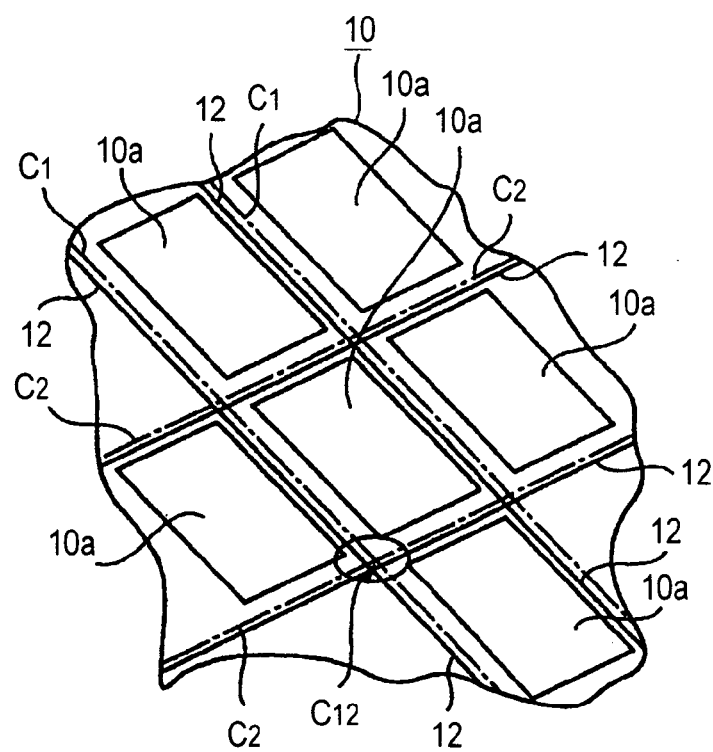
FIG. 3 is a schematic drawing for describing how a plurality of chips of an unusual (rectangular) shape are split from a substrate.
Figure 4:
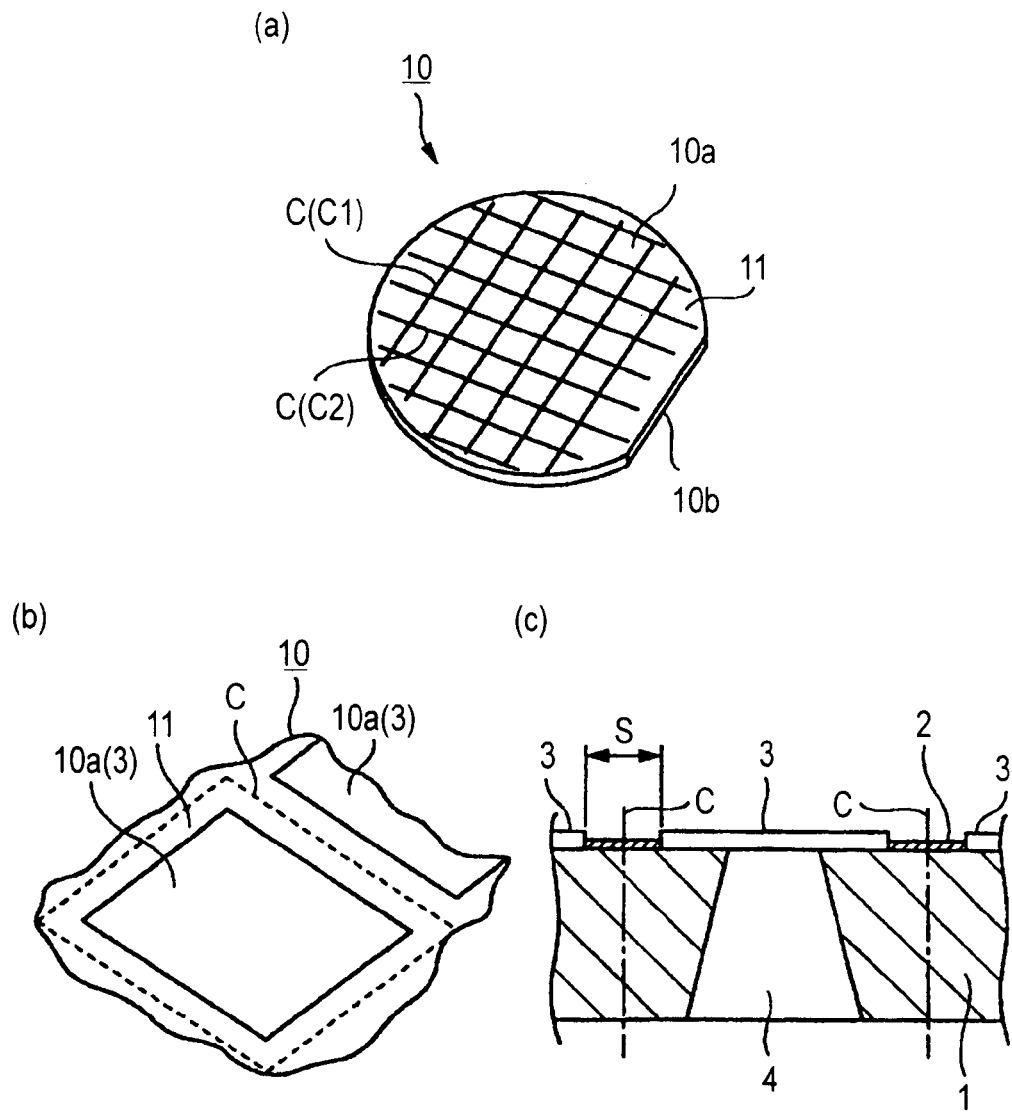
FIG. 4 is a drawing for describing the silicon substrate in the first embodiment of the present invention, FIG. 4(a) being a perspective view of the substrate, FIG. 4(b) being an enlarged view of a part of FIG. 4(a), and FIG. 4(c) being a sectional view of the portion of the silicon substrate shown in FIG. 4(b).

The beam of laser light L and the substrate itself are moved relative to each other so that the focal point of the optical system is moved along the intended splitting (fracturing) line C. As a result, a plurality of groups of cracks, in the form of a belt, are formed along the intended splitting lines C (FIGS. 3 and 4).

FIG. 1 is an enlarged view of the point of the substrate, which coincides with the focal point of the optical system, and its adjacencies.

After or prior to the formation of the groups of cracks such as those described above, a scratch 11a (shallow groove) is formed by a scoring tool or the like across the top surface of the substrate, as an object to be split, along the intended splitting lines C (C1 and C2), along which the substrate is to be split later. The intended splitting line is an imaginary line with no width, whereas the superficial scratch 11a formed along the intended splitting line is in the form of a groove having a certain width. The top surface of the substrate has only to be scratched so that the width of the resultant scratch (groove) will be no greater than the permissible width for such a defect as a chipping which potentially occurs during the splitting of the substrate. Here, a chipping means the unwanted crack which develops as the substrate is split. It is a void at the edge of the element chip. Further, since the superficial scratch 11a is formed in the top surface of the silicon substrate 10 by scratching the top surface of the substrate 10 with a scoring tool or the like, its internal surfaces are different from the surfaces of the internal cracks which form along the cleavage plane of the silicon substrate 10. When it is viewed with the naked eye, it does not coincide with a specific crystalline orientation plane of the silicon substrate formed of a single crystal of silicon.

After the formation of the superficial scratch 11a, and the formation of the cracks inside the silicon substrate 10 by the beam of laser light L, external force is applied to the substrate 10. As the external force is applied, the stress generated by the application of the external force concentrates to the superficial scratch 11a in the top surface of the substrate 10. As a result, a crack occurs between the bottom portion of the superficial scratch 11a and the top end of the internal crack formed by the beam of laser light L; the superficial scratch 11a becomes connected to the internal crack 12c. Usually, this crack is roughly straight. Even if this crack occurs in a zig-zag pattern (if crack develops along plurality of crystalline orientation planes peculiar to silicon substrate, it becomes zig-zag), the portion of the crack, which appears at the top surface 11 of the substrate 10, remains within the superficial scratch 11a in the form of a groove. In other words, the amplitude of the zig-zag pattern of the crack remains within the width by which the top surface 11 of the substrate 10 was scribed by the scoring tool. Therefore, normally, it does not occur that the crack develops in a manner of deviating from the intended splitting line C.

(Embodiment 1)

Next, the method for separating a plurality of element chips, as chips for forming an ink jet head, across each of which the structural components of an ink jet head, such as the circuit, as the logic element 10a, for driving an ink jet head, ink ejection orifices, etc., have been formed, from the silicon substrate 10, will be described.

The silicon substrate 10 shown in FIGS. 4(a) and 4(b) is formed of a silicon wafer 1 with a thickness of 625 µm, which is formed of a single crystal. Its top surface is parallel to the crystalline orientation (100) of the single crystal. Across the top surface of the silicon wafer 1, an oxide film 2 with a thickness of roughly 1 µm has been formed. On top of the oxide film 2, a plurality of nozzle layers 3 are disposed, which comprises the mechanisms for ejecting liquid such as ink, logic elements for driving these mechanisms, wiring, etc., making up a plurality of logic elements 10a, as shown in FIG. 4(c). Immediately below each nozzle layer 3, which contains the liquid ejection mechanism, etc., as described above, a liquid supply hole 4 (ink supply hole) is formed by etching the silicon wafer 1 by anisotropic etching. The plurality of nozzle layers 3 are formed on the silicon wafer 1 in such an arrangement that the silicon wafer 1 can be split, at the intended splitting lines C, into a plurality of element chips in the final stage of the manufacturing process; each intended splitting line C will be between the adjacent two nozzle layers 3. The intended splitting line C is formed in parallel to the crystal orientation of the silicon wafer 1. The gap S between the adjacent two nozzle layers 3 is at least roughly 100 µm.

Figure 5:
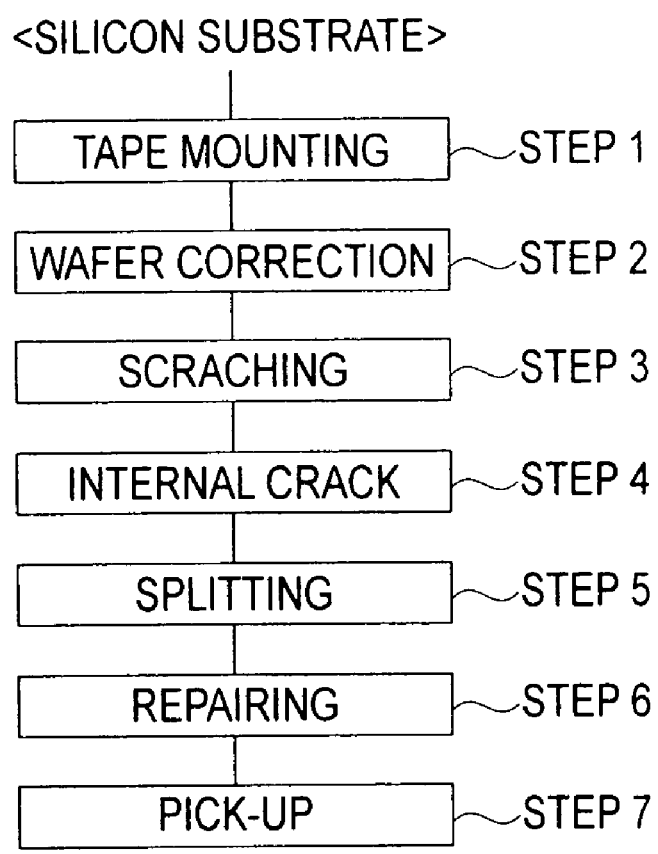
FIG. 5 is a flowchart of the process of splitting an object (silicon substrate), in the first embodiment.

FIG. 5 is a flowchart for describing the process for splitting the silicon substrate 10 into a plurality of logic elements 10a which will be made into a plurality of element chips. This process comprises seven steps: Step 1 for mounting the silicon wafer 1 with the use of adhesive tape; Step 2 for correcting the silicon wafer 1; Step 3 for cutting recesses (grooves) across the top surface of the silicon wafer 1; Step 4 for forming internal cracks; Step 5 for splitting the silicon wafer 1; Step 6 for touching up the element chips; and Step 7 for picking up (collecting) the element chips. Next, these steps will be described in the logical order.

[Wafer Mounting Step]

Figure 6:
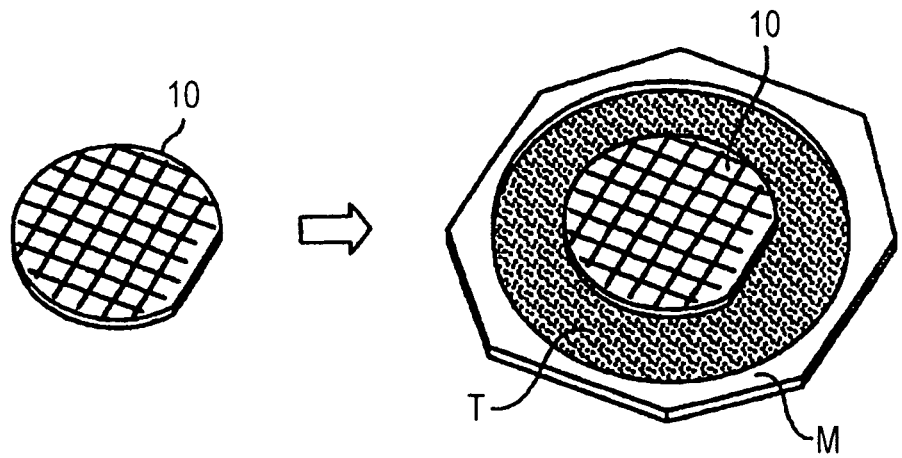
FIG. 6 is a schematic drawing for describing the process of mounting a silicon substrate with the use of a piece of adhesive tape.

Referring to FIG. 6, the silicon substrate 10 is mounted on a dicing frame M in order to prevent the elements from separating prior to the splitting step; it is placed on the dicing tape T pasted to the dicing frame M so that the silicon substrate 10 is adhered to the dicing tap T by the bottom surface.

As for the choices of dicing tape, a tape coated with adhesive curable with ultraviolet rays, a tape coated with pressure sensitive adhesive, a tape coated with ordinary adhesive, etc., are usable.

[Wafer Correcting Step (Wafer Flattening Step)]

Figure 7:
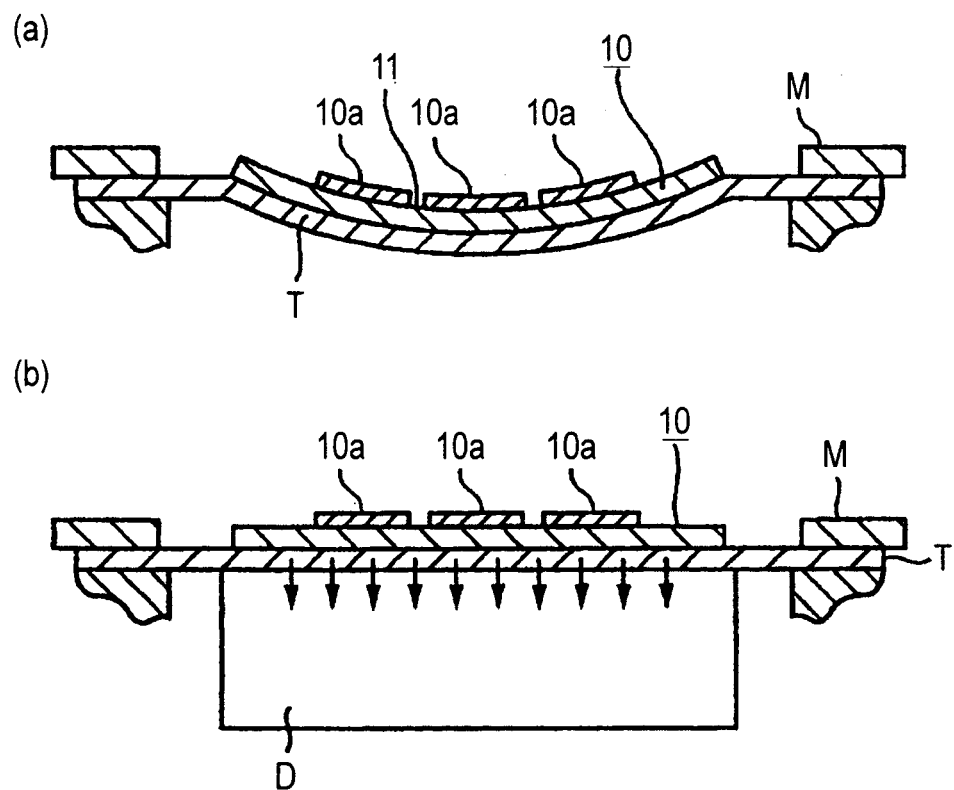
FIG. 7 is a schematic drawing for describing the process of correcting a wafer.

Each of the nozzle layers 3 which are formed of resin, on the top surface of the silicon substrate 10, as described above, exothermically contracts when hardening. Therefore, after the formation of the nozzle layers 3, the entirety of the silicon substrate 10 will have been deformed as shown in FIG. 7(a). If the silicon substrate 10 is exposed to a beam of laser light projected in the scanning manner while it is in this deformed state, various points on the top surface 11 of the silicon substrate 10 become different in the incident angle of the beam of laser light, making it impossible to precisely process the silicon substrate 10. Thus, it is necessary to correct the silicon wafer 10 before processing it with a beam of laser light. As for the method for correcting the silicon wafer 10, the silicon wafer 10 is corrected by suctioning the silicon substrate 10 from the dicing tape T side with the use of a suction stage D as shown in FIG. 7(b).

[Groove Forming Step]

Next, in order to precisely split the silicon substrate 10 into a plurality of logic elements 10a, the superficial scratches 11a (shallow grooves) are formed across the top surface 11 of the silicon substrate 10, following the intended splitting lines C. It is preferable that the superficial scratches 11a are formed so that the center line of each superficial scratch 11a and the center line of the corresponding intended splitting line C roughly coincide with each other.

The method of splitting the silicon substrate 10 into the plurality of element chips is different from the method of dicing the silicon substrate 10 into the plurality of element chips with the use of a blade in that, unlike the latter, in the case of the former, virtually no part of the silicon substrate 10 is removed from the adjacencies of the intended splitting lines when the silicon substrate 10 is split into the plurality of element chips. Therefore, the maximum tolerable width for the splitting defects, such as shaving, chipping (substrate defects), etc., is equivalent to the width by which the top surface 11 of the silicon substrate 10 is scribed. Scribing width, here, is equivalent to the width of the area of the substrate 10, which can be removed without damaging the element chips when separating the element chips, and its includes the intended splitting lines. Thus, the width of the superficial scratch 11a has only to be set to be no more than the tolerable size for the defects which may occur when the silicon substrate 10 is split. For example, if the tolerable size for the damage which occurs to the peripheral edges of the element chips as the edges are chipped when the silicon substrate 10 is split, is no more than 30 µm from the corresponding peripheral edge, the scribing width has only to be no more than 30 µm, for example, roughly 20 µm.

In other words, forming the superficial scratch 11a following the intended splitting line C causes the stress attributable to external force applied to split the silicon substrate 10, to concentrate to the scratch 11a. As a result, a crack starts from the superficial scratch 11a and progresses inward of the silicon substrate 10. The concentration of the stress occurs within a limited area within the area between the adjacent two element chips 10a; the area to which the stress concentrates is the area within the superficial scratch 11a, being therefore narrower than the superficial scratch 11a. Therefore, it does not occur that the logic circuits or the like are damaged due to the development of unwanted cracks.

As for the method for creating the superficial scratches 11a, all that is necessary is to score the top surface 11 of the silicon substrate 10 with a scriber 40 equipped with a carbide or diamond tipped blade, following the intended splitting lines C as shown in FIGS. 8(a) and 8(b). From the standpoint of stress concentration, the superficial scratch 11a is desired to be no less than 2 µm in width and no less than 1 µm in depth. However, the dimensions of the superficial scratch 11a need to be within a range in which the superficial scratch 11a does not interfere with the path of the beam of laser light L for creating the internal crack 12. More specifically, the value for the depth of the superficial scratch 11a is desired to be large enough to cause the stress to be concentrated to the area between the superficial scratch 11a and internal crack 12, and yet, it may be smaller than the thickness of the oxide film 2, or the surface layer of the silicon substrate 10, as shown in FIGS. 8(a) and 8(b) Further, even if it is the same as the thickness of the oxide film 2 as shown in FIG. 8(c), or greater than the thickness of the oxide film 2, there will be no problem.

The formation of the superficial scratch 11a is mandatory for the top surface 11 having the logic elements 10a. However, the superficial scratch 11a may be formed not only on the top surface 11 of the silicon substrate 10, but also, the bottom surface of the silicon substrate 10 as well as the lateral surfaces of the silicon substrate 10.

FIG. 9(a) is a top plan view of the silicon substrate 10, and FIG. 9(b) is a sectional view of the edge portion of the silicon substrate 10, as seen at the line A—A in FIG. 9(a). Ordinarily, in order to prevent the peripheral edges of a silicon substrate from chipping or cracking, the peripheral edge is chamfered as shown in the drawings. The superficial scratch 11a is formed across this slanted surface 10c (formed by chamfering), as well as the top surface 11 of the silicon substrate 10, by processing the silicon substrate 10 as shown in FIG. 9(c).

Figure 10:
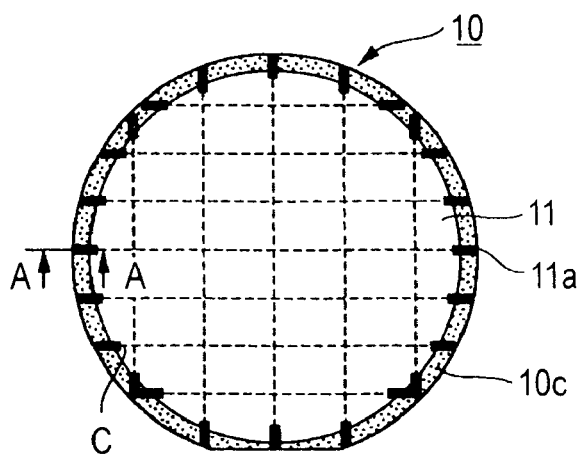
FIG. 10 is a schematic drawing for describing the processing of the surface areas of the silicon substrate, in the adjacencies of the chamfered edge.
Figure 10:
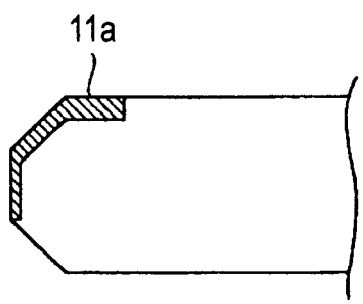
Figure 10:
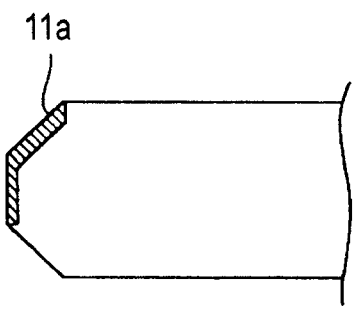
Figure 10:
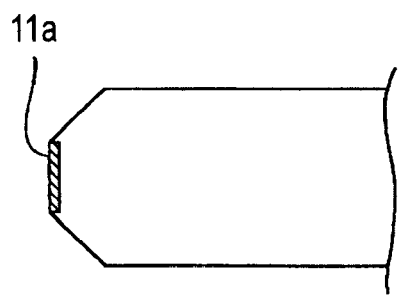
Figure 11:
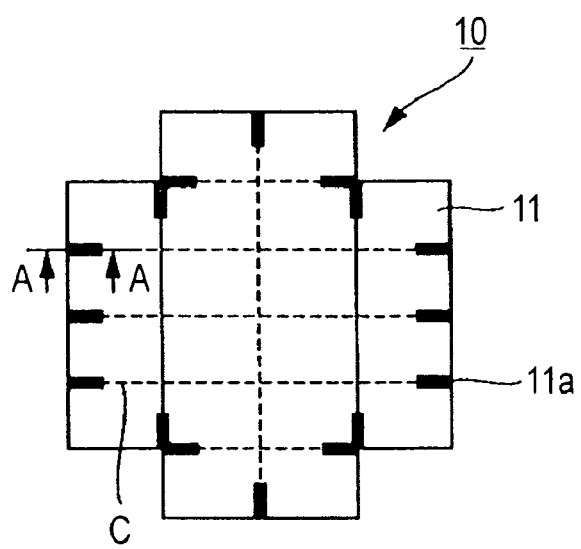
FIG. 11 is a schematic sectional drawing for describing the processing of the surface areas of the silicon substrate, in the adjacencies of the chamfered edge.
Figure 11:
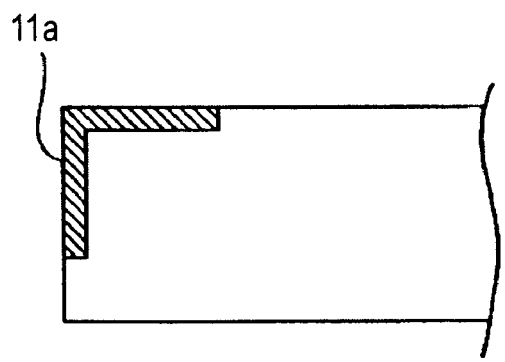

When the direction of the cleavage plane of the silicon substrate 10 at the top surface 11 of the silicon substrate 10 coincides with the direction of the intended splitting line C, the surface areas of the silicon substrate 10 across which the superficial scratch 11a is to be formed may be only the surface of the chamfered periphery of the silicon substrate as shown in FIG. 10(a). Referring to FIGS. 10(b) and 10(c), which are sectional views of the edge portion of the silicon substrate 10 at the line A—A in FIG. 10(a), as for the formation of the superficial scratch 11a across the edge portions of the silicon substrate 10, the superficial scratch 11a may be formed across the slanted surface 10c (formed by chamfering), periphery of the top surface 11, and vertical lateral surface (FIG. 10(b)); across the slanted surface 10c (formed by chamfering), and vertical lateral surface (FIG. 10(c)); or only the vertical lateral surface (FIG. 10(d)). Further, the superficial scratch 11a may be formed as shown in FIG. 11(a). In this case, the peripheral portions of the silicon substrate 10, which do not yield complete element chips are vertically cut off before the formation of the superficial scratch 11a. Then, the superficial scratch 11a is formed across the edge portions of the remaining portion of the silicon substrate 10. Also in this case, the areas of the silicon substrate 10 across which the superficial scratch 11a is to be formed may be the peripheral portion of the top surface of the remaining portion of the silicon substrate 10 (FIG. 11(b)) and the vertical lateral surface of the remaining portion of the silicon substrate 10 (unshown). In other words, all that is important when selecting the surface areas of the silicon substrate 10 across which the superficial scratch 11a is to be formed is that the selection is made in consideration of the location of the internal processing of the silicon substrate 10, which will be described later, and also, that the formation of the superficial scratch 11a across the selected areas ensures that the silicon substrate 10 is accurately split. When the superficial scratch 11a is formed only across the peripheral portion of the silicon substrate 10, the process for splitting the silicon substrate 10, which will be described later, has only to be carried out so that a crack develops from the superficial scratch 11a.

Incidentally, if the superficial scratch 11a is formed on the bottom surface of the silicon substrate 10 before the above-mentioned wafer correcting process is carried out, it becomes easier for the bottom side of the silicon substrate 10 to be compressed in the horizontal direction, and therefore, easier for the silicon substrate 10 to be flattened. In this case, compared to the superficial scratch 11a on the top surface 11, the superficial scratch 11a to be formed on the bottom surface of the silicon substrate 10 is desired to be more suitable for compressing the bottom portion of the silicon substrate 10; it is desired to be wider than the superficial scratch 11a formed on the top surface 11. As for the formation of the superficial scratch 11a on the bottom surface of the silicon substrate 10, the superficial scratch 11a may be formed by anisotropic etching, when forming the ink supply holes 4 by anisotropic etching, because this will shorten the processing time.

Forming the superficial scratch 11a through the scribing process, in which the tool 40 is used, before the formation of the internal cracks, which will be described later, as in this embodiment, makes it possible to prevent the silicon substrate 10 from developing unwanted cracks due to the load which applies to the silicon substrate 10 when the silicon substrate 10 is processed. It also makes it possible to use the superficial scratch 11a as the referential line for accurately showing the point (line) to which a beam of laser light is to be focused in the later stage, improving thereby the efficiency with which the silicon substrate 10 is processed by a beam of laser light.

Obviously, the superficial scratch 11a may be formed after the formation of the internal cracks by a beam of laser light L. In such a case, the problem that the beam of laser light L is eclipsed by the superficial scratch 11a (beam of laser light L is partially reflected by internal surfaces of superficial scratch 11a (in form of groove), and therefore, amount of laser light L which enters the substrate becomes smaller, does not occur. Therefore, the internal cracks can be more efficiently formed.

Figure 8:
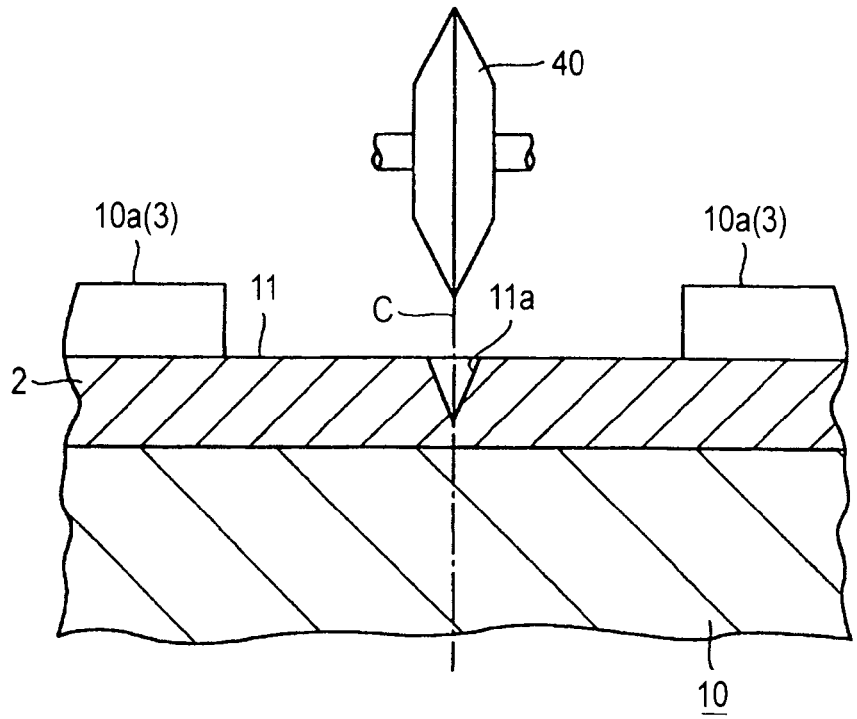
FIG. 8 is a schematic drawing for describing the scoring process for forming superficial scratches, FIG. 8(a) showing the case in which the depth of the superficial scratch is no more than the thickness of the oxide film, and FIG. 8(b) showing the case in which the depth of the superficial scratches is equal to the thickness of the oxide film.
Figure 8:
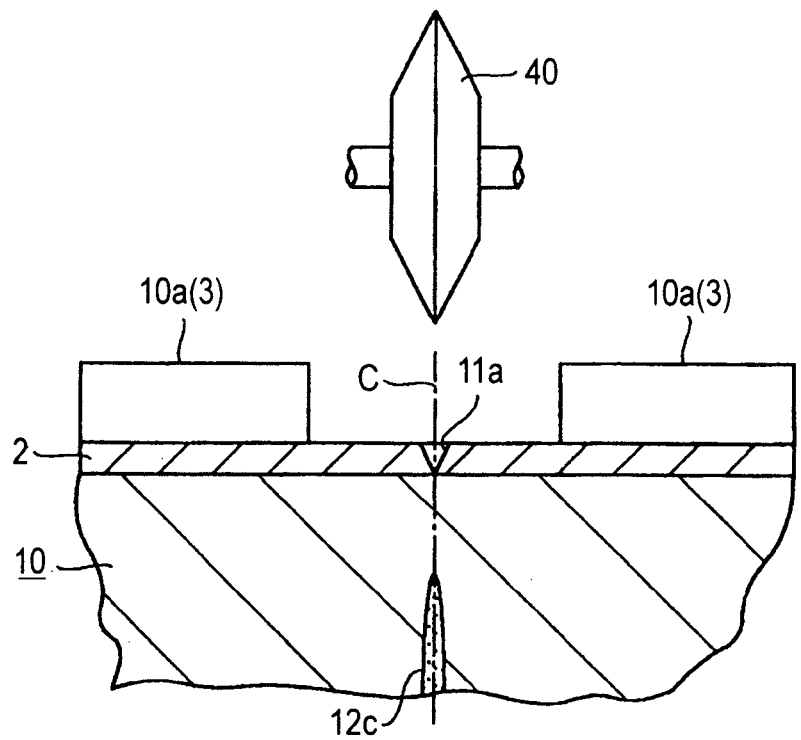

The superficial scratch 11a may be formed with the use of a method other than the method depicted in FIG. 8.

The inventors of the present invention compared the following three processes (I), (II), and (III) for forming the superficial scratch 11a, in terms of the accuracy with which the silicon substrate 10 can be split. The processes (II) and (III) are carried out with the use of a processing device based on a pulse laser, which is used for the formation of the internal cracks, which will be described later, and the beam of laser light L was condensed to the adjacencies of the top surface 11 of the silicon substrate 10. The difference between the processes (II) and (III) was created by changing the laser output, and the depth of the point, to which the beam of laser light L was focused, from the top surface 11 of the silicon substrate 10.

Figure 12:
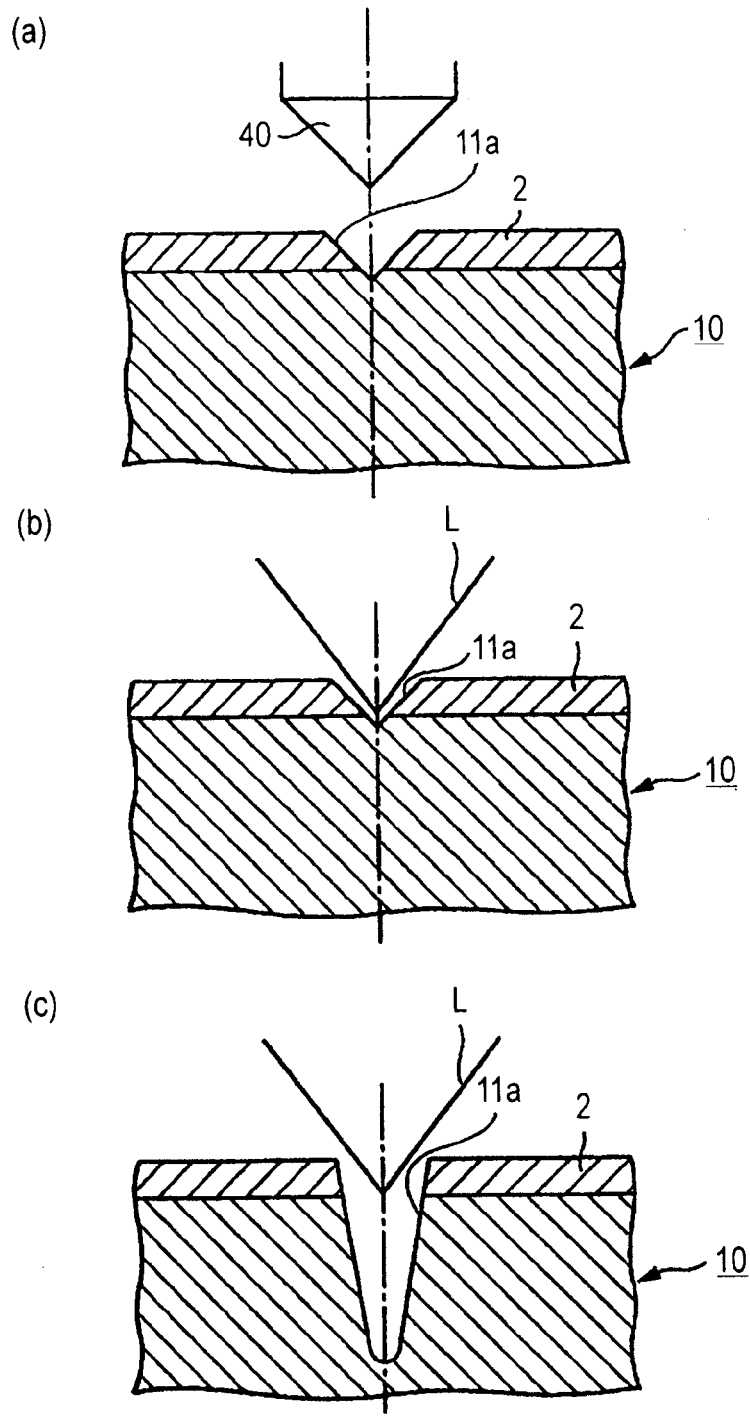
FIG. 12 is a schematic drawing of the processed top surface of a silicon substrate, FIG. 12(a) showing the scratch (groove) made by a diamond tipped tool, FIG. 12(b) showing the shallow scratch (groove) formed by a beam of YAG laser, and FIG. 12(c) showing the deeper scratch (groove) formed by a beam of YAG laser.

(I) The superficial scratch 11a (2–5 μm deep), shown in FIG. 12(a), was formed with the use of a diamond tipped tool as shown in FIG. 12(a);

(II) The superficial scratch 11a (2–5 μm deep), shown in FIG. 12(b), was formed with the use of YAG laser light; and (III) The superficial scratch 11a (30 μm deep, and wedge-shaped in cross section), shown in FIG. 12(c), was formed with the use of YAG laser light.

In each case, the silicon substrate 10 was a silicon wafer with a thickness of 625 μm, formed of a single crystal. Its top surface is parallel to the crystalline orientation (100) of the single crystal. A plurality of the internal cracks 12 were formed directly below the corresponding superficial scratch 11a, following "internal crack formation process" which will be described later, so that they extend from a level, which is 10 μm deep from the top surface 11, in the thickness direction of the silicon substrate 10 (depth direction, or direction perpendicular to top surface among directions intersectional to top surface), to a lower level, which is roughly 100 μm from the bottom surface, and interconnect with each other. As a result, virtually an apparently single internal crack with a size of 470–480 μm was formed.

The results are as follows:

As for the external force required to split the silicon substrate 10, Case (II) required the largest external force to split the silicon substrate 10, and Cases (II) and (I) are the second and third, respectively. As for the amplitude of the resultant line of split, the line of split remained within the superficial scratch 11a; in other words, the silicon substrate 10 was precisely split. In the case of Process (I), which is a non-thermal process, a crack which developed from the superficial scratch 11a, the center line of which coincided with the center line of the intended splitting line, progressed to the internal crack 12 immediately below the superficial scratch 11a. As a result, the silicon substrate 10 was most precisely split; the silicon substrate 10 split so that the surfaces resulting from the splitting of the silicon substrate 10 became virtually perpendicular to the top and bottom surfaces of the silicon substrate 10.

Figure 13:
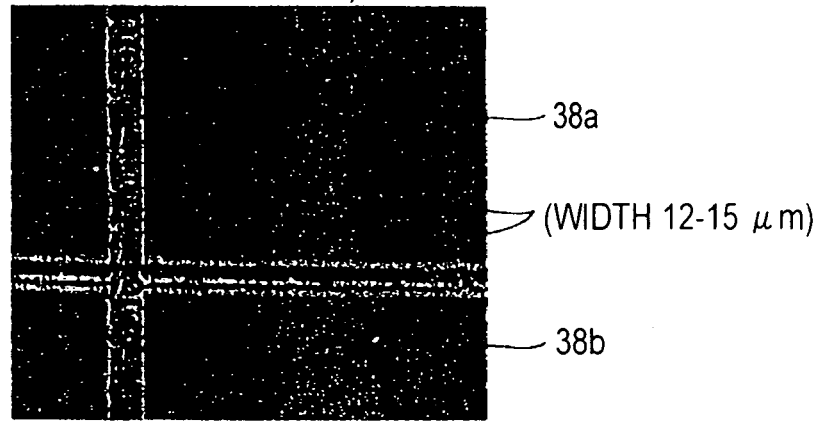
FIG. 13 is a schematic drawing showing the silicon substrate across the top surface of which scratches (grooves) have been formed, and from which one of the chips has been separated.
Figure 13:
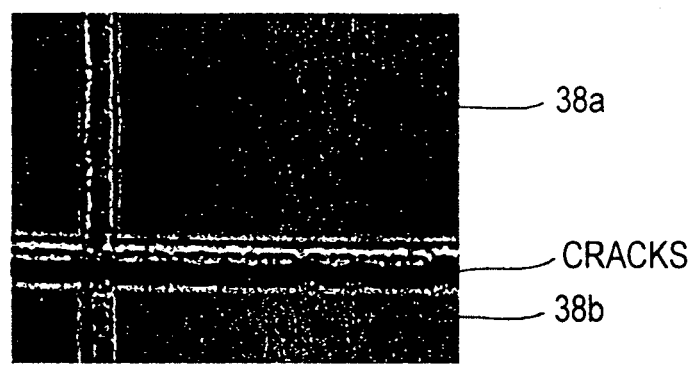
Figure 13:
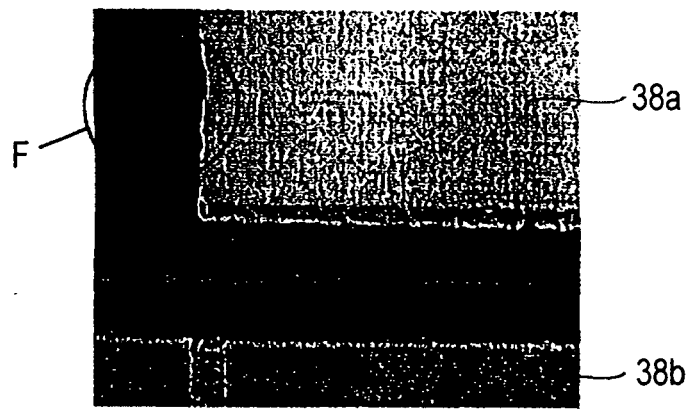

FIG. 13 shows the examples of the final crack which resulted from the superficial scratch (12–15 μm in width, and roughly 3 μm in depth), which was different from the above described one and was formed with the use of a process similar to Process (II). The superficial scratch 11a was shaped so that the bottom portion of its cross section looked like the shape of the bottom of a pan. In this case, even when a separated element chip had a relatively large edge defect such as an F portion shown in FIG. 13(c)), the defect was smaller than the width of the superficial scratch 11a.

It has been experientially known that even if the internal crack 12, intended split line C, and superficial scratch 11a of a silicon substrate 10 align in the direction perpendicular to the top surface 11 of the silicon substrate 10, the amount of the force required to split the silicon substrate 10 is made different by the difference in the shape of the superficial scratch 11a, and that the greater the amount of force necessary to split the silicon substrate 10, the lower the level of precision at which the silicon substrate 10 is split.

In other words, the case shown in FIG. 13 indicates that even if the superficial scratch 11a is formed through a process such as Process (II), and therefore, a relatively large amount of external force is required to split the silicon substrate 10, as long as the conditions under which the silicon substrate 10 is processed across the top surface, the conditions under which it is internally processed, and the conditions under which it is split, are properly selected, the silicon substrate 10 can be split so that the line of split do not deviate from the superficial scratch 11a; in other words, the size of the defects which may occur to the periphery of an element chip as the silicon substrate 10 is split can be made smaller than the width of the superficial scratch 11a, by properly selecting the abovementioned conditions.

The reason Processes (II) and (III) required a greater amount of force to split the silicon substrate 10 than Process (I) seems to be that it is more difficult for a crack to progress in the adjacencies of the superficial scratch 11a, in Processes (II) and (III) than in Process (I). In this case, when it is taken into consideration that the superficial scratches 11a formed by Processes (I) and (II) are similar in shape, it is evident that there is no large correlation between the shape of the superficial scratch 11a and the force necessary to slit the silicon substrate 10. Rather, in consideration of the fact that when the superficial scratches 11a were formed through Processes (II) and (III), there was debris formed of the substrate materials melted by the application of heat, in the adjacencies of the superficial scratches 11a, the difference in the force required to split the silicon substrate 10 between Processes (II) and (III), and Process (I) seems to be attributable to the phenomenon that the silicon in the adjacencies of the superficial scratch 11a was made amorphous by the heat generated by the laser light, preventing therefore the crystallinity of the silicon substrate 10 from contributing to the splitting of the silicon substrate 10.

Based on the above described discoveries and theories, in order to split the silicon substrate 10 into a plurality of element chips with the application of as small an amount of force as possible, various processes which do not require the application of heat to the silicon substrate 10 by the amount large enough to melt the silicon have been studied as the process for forming the superficial scratch 11a. For example, it is feasible to use chemical etching, that is, a method which does not thermally melt silicon, instead of the above described mechanical method which uses a scriber. As described above, forming a V-shaped superficial scratch 11a by anisotropic etching through the same process in which ink supply hole 4 is formed from the bottom surface of the silicon substrate 10, reduces the overall length of the chip manufacturing process.

[Internal Crack Formation Step]

Figure 14:
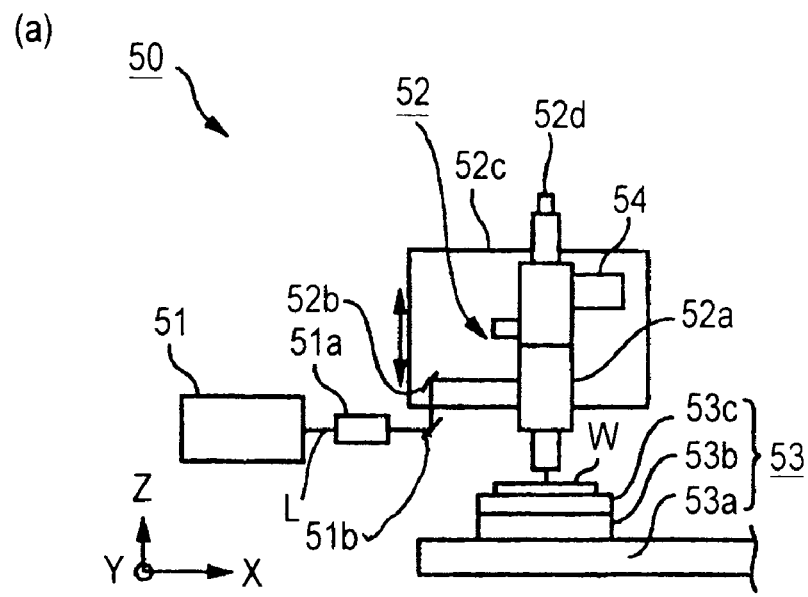
FIG. 14 is a schematic drawing for describing the process through which an internal crack is formed, FIG. 14(a) showing the apparatus for projecting a beam of laser light, and FIG. 14(b) showing the mechanism of the development of an internal crack.
Figure 14:
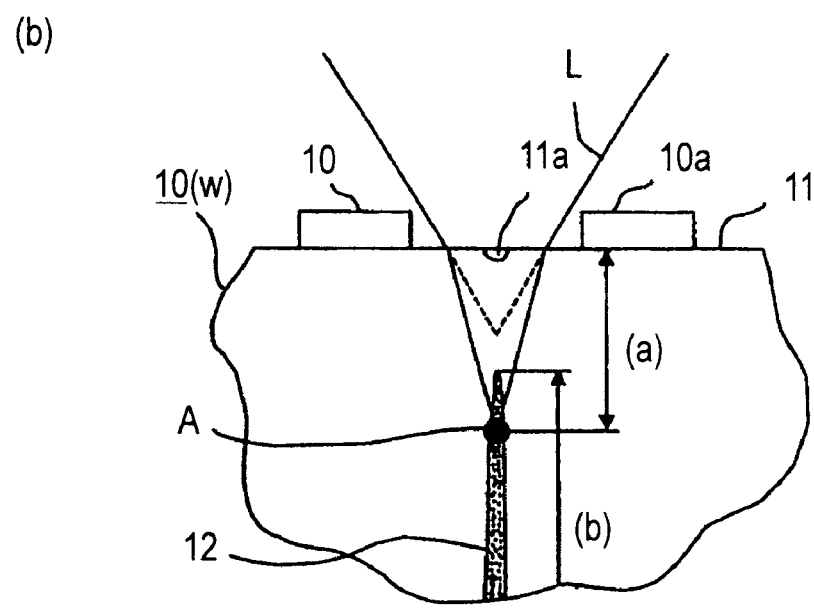

In this step, internal cracks such as the one shown in FIG. 2 are formed with the use of a processing apparatus 50 shown in FIG. 14(a). This processing apparatus 50 comprises a light source optical system, a light condensing optical system 52; an automatic stage 53, and an unshown alignment optical system. The light source optical system comprises a light source 51, a beam expansion system 51a, a mirror, etc. The light condensing optical system 52 comprises an object lens 52a (of microscope), a mirror 52b, etc. The automatic stage 53 comprises an X stage 53a, a Y stage 53b, a micro-adjustment stage 53c, etc. The alignment optical system is for aligning the silicon substrate 10 as a workpiece with the reference to an orientation flat 10b (FIG. 4). As the light source 51, the fundamental wave (1,064 nm) of a pulse YAG laser is used.

The pulse width is in the range of 15–1,000 nsec, and the frequency is in the range of 10–100 KHz. The excitation light source of this laser is a semiconductor laser, and the power delivered to this excitation light source can be varied by varying the current injected into the semiconductor laser. The pulse width can be varied by varying the amount and frequency of this injection current.

The selection of the laser light L is made based on the spectral transmission factor. Therefore, any laser light L is usable as long as a strong electric field can be formed at its converging point A, and its wavelength is within the range which enables it to transmit through silicon.

The beam of laser light L emitted from the light source 51 enters the light condensing optical system 52 through the beam expansion system 51a, etc.

As the microscope object lens 52a of the light condensing optical system 52, a lens with a magnification of, for example, 20 (NA=0.42) or 50 (NA=0.55) is employed. Further, in consideration of the refractive index of silicon, a condenser lens which is usable for microscopic observation, and is optimal for the internal processing of the silicon, may be employed. The beam of laser light L is made to converge to the workpiece W by the light condensing optical system 52, and enters the silicon substrate 10 through the top surface 11 of the silicon substrate 10, across which the logic elements 10a are present, as shown in FIG. 14(b).

The optical conditions, here, are set so that the presence of the superficial scratch 11a on the top surface 11 is insignificant. More specifically, the method of upping the power in consideration of the energy loss due to the presence of the superficial scratch 11a, the method of positioning the beam of laser light L so that it enters the silicon substrate 10 through the areas with no superficial scratch 11a, or the like, is used. As the beam of laser light enters the silicon substrate 10 through the top surface 11, it is refracted at the top surface 11, and converges to the point A, which is a predetermined distance (a) inward of the top surface 11, and creates the internal crack 12c.

According to experiments, it is desired that the processing conditions be set in accordance with the point of beam convergence, structure of the oxide film 2, and the wavelength of the laser used for the process, so that the distance between the top surface 11 of the silicon substrate 10 and the top tip of the internal crack 12c shown in FIG. 2 will become no less than 10 μm, for the following reason. That is, there are the possibilities that the internal crack 12c accidentally becomes connected to the superficial scratch 11a during the processing of the silicon substrate 10, and/or that the top surface 11 of the silicon substrate 10 will be damaged because of the conditions under which the silicon substrate 10 is exposed to the beam of laser light L. Therefore, it must be ensured that these possibilities will not be realized.

The depth (a) of the convergence point A can be controlled by moving either the workpiece W, that is, the silicon substrate 10, or the light condensing optical system 52. When the refractive index of the silicon substrate 10 relative to a wavelength of 1,064 nm is n, and the amount of the mechanical movement (distance by which either silicon substrate 10 or light condensing optical system 52 is moved in direction parallel to optical axis) is d, the amount of the optical movement of the convergence point A is nd. The refractive index n of the silicon substrate 10 is roughly 3.5 when the wavelength is in the range of 1.1–1.5 μm; the actual value of the experimentally measured refractive index n of the silicon substrate 10 was very close to 3.5. In other words, when the amount of the mechanical movement is 100 μm, the convergence point A of the beam of laser light L is 350 μm inward of the silicon substrate 10 from the top surface 11.

Further, that the refractive index of a substance is near 3.5 indicates that the substance is substantial in reflectance. Generally, when a beam of light enters a substance at right angle, reflectance is $((n-1)/(n+1))^2$. Therefore, it is roughly 30% in the case of the silicon substrate 10, and the rest of the optical energy reaches inward of the silicon substrate 10. Further, the silicon substrate 10 itself absorbs a certain amount of light. Therefore, the optical energy which actually converges to the convergence point A is even smaller. When the transmittance of the silicon substrate 10 with a thickness of 625 μm was actually measured, it was roughly 20%.

As the beam of laser light L converges to the convergence point A, the portion of the silicon located at the convergence point A partially changes in crystalline structure. As a result, the internal crack 12 develops. According to the results of experiments, the length (b) of the internal crack 12 was in the range of 2–100 μm.

As described above, the internal portion of the silicon substrate 10, directly below the intended splitting line C, is processed by forming, first, the internal crack 12 starting from a point in the silicon substrate 10, and then, moving the convergence point A relative to the silicon substrate 10 following the intended splitting line C. Referring to FIG. 3, there are two kinds of intended splitting lines C, that is, lines C1 and C2, which are conceived with reference to the orientation flat 10b and are perpendicular to each other.

The workpiece W, or the silicon substrate 10a, is mounted on the automatic stage 53 movable in both X and Y directions, and therefore, its position can be freely changed in the horizontal plane. As for the movement of the workpiece W in the direction parallel to the optical axis (direction parallel to depth direction of silicon substrate), or the direction Z, the workpiece W is moved by providing the automatic stage, on which the workpiece is mounted, or the light condensing optical system, with a Z stage 52c, so that the gap between the light condensing optical system 52 and workpiece W can be varied.

The speed at which the workpiece W is moved in the X or Y direction is determined in consideration of the frequency and/or crack pattern. Ordinarily, when the frequency is in the range of 10–100 KHz, the range of 10–100 mm/sec is considered to be the standard moving speed range. If the moving speed exceeds 100 mm/sec, the interior of the silicon substrate 10 is discontinuously processed in terms of the moving direction. In some cases, the distance between the adjacent two cracks, in terms of the direction of the intended splitting line C, becomes substantial, or the like problems occur, adversely affecting the following step, or the splitting step.

As for the light condensing optical system 52, the observation camera 52d is positioned so that the point of the workpiece, to which the beam of laser light L is made to converge, coincides with the focal point of the observation camera 52d. Since the reflectance of the silicon substrate 10 is roughly 30%, a filter which matches the output of the light source is employed in order to prevent the elements of the observation camera 52 from being damaged. As for the illumination for observation, in order to make Koehler illumination possible, a relay lens is employed so that the position of the entrance pupil of the microscope object lens 52a used for light condensation coincides with the position of the light source. Further, illumination is done through a filter to prevent, as much as possible, the optical element for illumination from being damaged.

The distance to the workpiece W is measured by employing an autofocus optical system 54 in addition to the above described observation optical system. The autofocus optical system 54 obtains the contrast of the image obtained by the observation camera 52d, and calculates the degree of focus, and inclination. In reality, the best position is selected by measuring the degree of focus, and inclination, while minutely changing the distance to the workpiece W in order to measure this contrast. The autofocus optical system makes adjustment based of the parallelism of the workpiece W, or the silicon substrate 10. Incidentally, the autofocus optical system may be of a type which measure a distance by projecting a beam of laser light.

The silicon substrate 10 is internally processed as described above, and attention must be paid to the following points before starting to process the silicon substrate 10.

Figure 15:
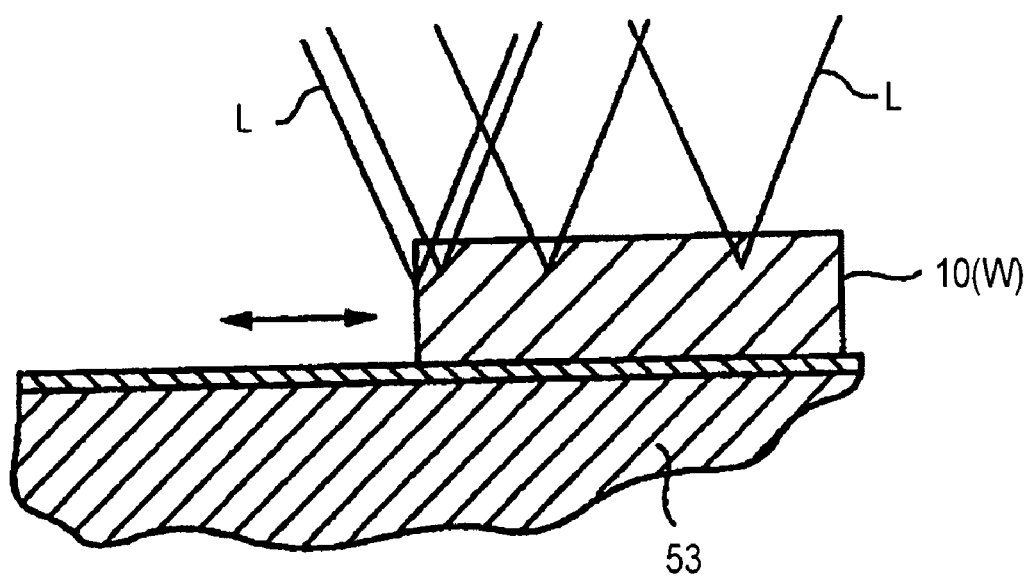
FIG. 15 is a schematic drawing for describing the process through which an internal crack is formed through the edge portions of the silicon substrate.

(I) Referring to FIG. 15, the processing of the silicon substrate 10 is to be started from the edge of the silicon substrate 10. However, the periphery of the silicon substrate 10 is chamfered as described before. Therefore, there is the possibility that the silicon substrate 10 will be processed following a line which does not align with the intended splitting line in terms of the direction perpendicular to the top surface 11 of the silicon substrate 10. Referring to FIG. 9(d) which is an enlarged view of the portion E in FIG. 9(a), the surface (tilted) 10c resulting from the chamfering is different from the literal top surface 11 of the silicon substrate 10 in that in the case of the former, the direction of its normal line is different from the direction in which the beam of laser light enters it, and therefore, the beam of laser light is made to converge to a point offset from the intended convergent point A. Consequently, the line of internal cracks is formed in the direction different from the intended splitting line C as shown in the drawings. If a group of internal cracks is formed in the above described direction, there is the possibility that when splitting the silicon substrate 10 as will be described later, the silicon substrate 10 will begin to split from its periphery, and will split along the line different from the intended splitting line C as shown in FIG. 9(e). As for the means for processing the silicon substrate 10 so that the internal crack is formed following the intended splitting line C even in the chamfered portion of the silicon substrate 10, it is feasible to use such a method that changes the incident angle of the beam of laser light in accordance with the angle of the slanted surface formed by the chamfering. However, the employment of such a method makes the system complicated, being therefore impractical. It is also possible to form internal cracks only in the portion of the silicon substrate 10 below the literal top surface 11 (no internal crack is formed in portion of silicon substrate 10 below the slanted surface 10c resulting from the chamfering), and the internal cracks for splitting the silicon substrate 10 are formed so that the internal cracks progresses from the center of the silicon substrate 10 toward the periphery. In this case, however, it is possible that the internal cracks ceases to progress in the adjacencies of the slanted peripheral surface 10c. In comparison, in this embodiment, the superficial scratch 11a has been formed following the intended splitting line C, and therefore, the progression of the internal cracks is guided by the superficial scratch 11a. Therefore, it does not occur that the silicon substrate 10 splits following a line other than the intended splitting line C. In other words, it is possible to prevent the problem that unwanted cracks develop from the peripheral slanted surface 10c of the silicon substrate 10.

As will be evident from the above description of this embodiment, it is desired that the internal processing is limited to the portion of the silicon substrate 10 below the literal top surface (exclusive of peripheral slanted surface resulting from chamfering); the point at which the internal processing ended coincides with the border between the peripheral slanted surface resulting from the chamfering and the literal top surface, or a point slightly offset toward center from the border.

(II) Referring to FIG. 3, when splitting the silicon substrate 10 into a plurality of chips of an unusual shape, for example, rectangular chips, first, a group of internal cracks 12 is formed following the intended split line C1 (first split direction), which is parallel to the longer edges of each chip, and then, a group of internal cracks 12 is formed following the intended splitting line C2 (second spit direction), which is parallel to the shorter edges of each chip.

When the silicon substrate 10 is holding chips of an unusual shape, more specifically, rectangular chips, the problem that the silicon substrate 10 fails to completely split, or the problem that the silicon substrate 10 undesirably splits, are more likely to occur when splitting the silicon substrate 10 along the line parallel to the longer edges of each chip than when splitting the silicon substrate 10 along the line parallel to the shorter edges of each chip. According to Process (II), it does not occur that the beam of laser light for internally processing the silicon substrate 10 following the intended splitting line C1 which is parallel to the longer edges of each chip is partially blocked by the group of internal cracks formed following the intended splitting line C2 which is parallel to the shorter edges of each chip. Therefore, it is ensured that the silicon substrate 10 is internally and satisfactorily processed following the intended splitting line C1 which is parallel to the long edges of each chip.

As described above, the length of the internal crack formed per convergence point A is 2–100 μm, whereas the thickness of the silicon substrate 10 which is to be internally processed is 625 μm. Therefore, in order to easily and accurately split the silicon substrate 10 at the intended splitting line on the top surface 11 of the silicon substrate 10, a plural number of internal portions of the silicon substrate 10 in terms of the thickness direction of the silicon substrate 10 must be processed per processing point in terms of the horizontal direction. As for the order in which the plural number of internal portions of the silicon substrate 10 are processed, the portion farthest (deepest) from the top surface 11 is to be processed first, and then, upward therefrom, toward the top surface 11, one by one.

Figure 16:
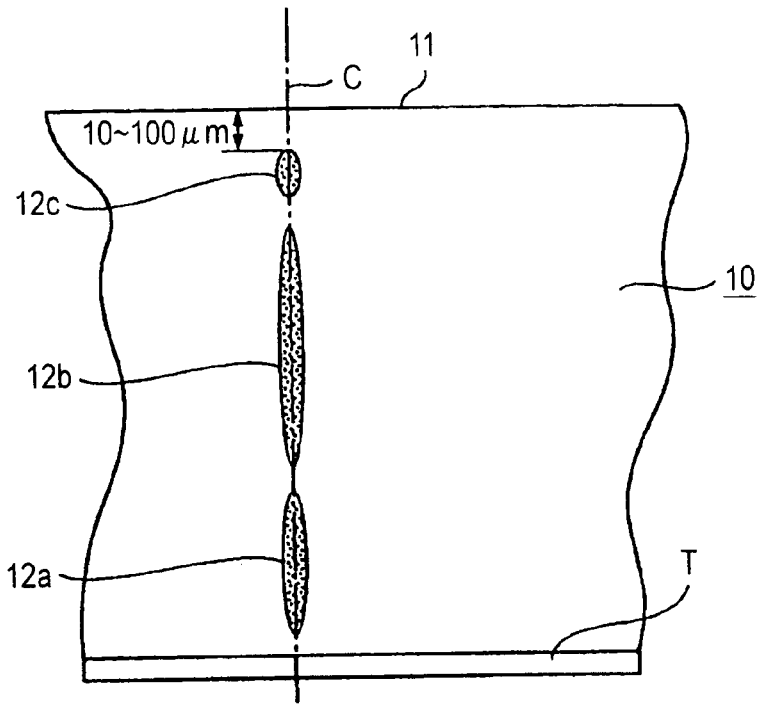
FIG. 16 is a schematic drawing for depicting a plurality of groups of internal cracks different in depth and density.
Figure 16:
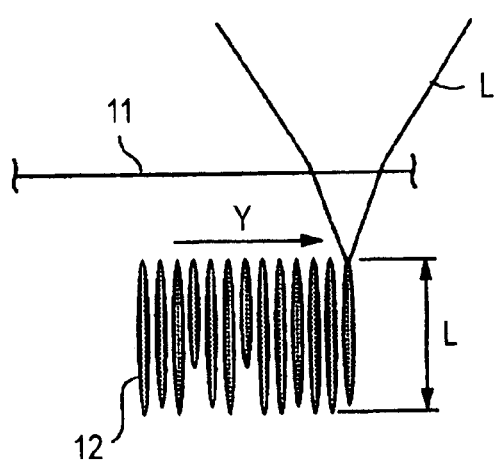
Figure 16:
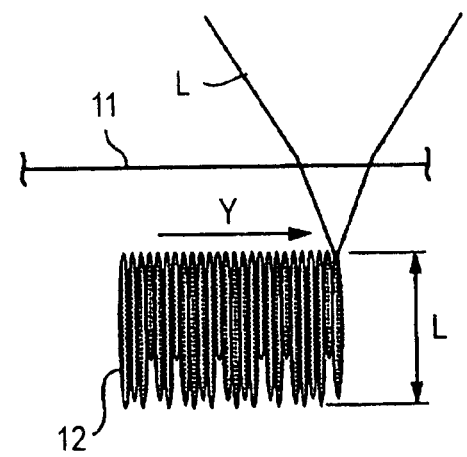

Referring to FIG. 16(a), all the n-th cracks, in terms of the thickness direction of the silicon substrate 10, of all the processing points, in terms of the horizontal direction of the silicon substrate 10, are formed so that they become the same in depth and align in parallel in the direction parallel to the intended splitting line C. For example, the group of internal cracks to be formed at a predetermined depth, for example, the group of internal cracks 12a, are formed by internally processing the corresponding portions of the silicon substrate 10 with the beam of laser light under the predetermined conditions, and therefore, all internal cracks 12 are expected to be the same in shape. In reality, however, the resultant internal cracks are slightly different in shape, even within the same group, as shown in FIGS. 16(b) and 16(c), because the shape and size in which an internal crack is formed by the heat from a beam of laser light L at a given point to which the beam of laser light L is made to converge is more or less spontaneous. However, such processing conditions as the laser output or the configuration of the lens system, etc., the material for the substrate 10, that is, the workpiece, the processing temperature, the surface condition of the substrate 10, etc., in other words, the processing conditions exclusive of the uncontrollable ones, are controlled. Therefore, all the internal cracks are formed in more or less the same length. Therefore, the length of an internal crack can be controlled as the typical length of an internal crack.

As for the means for controlling the length of the internal crack 12 in the silicon substrate 10, controlling the temperature difference between the top and bottom surfaces of a workpiece when projecting a beam of laser light on the workpiece is feasible. Further, increasing or decreasing the diameter of the beam of laser light L at the convergence point A and the amount of energy the beam of laser light L provides at the convergence point A, varying the amount by which the laser is provided with electric current, and varying the oscillation frequency, are also feasible, because varying these parameters varies the pulse width of the laser, which in turn affects the length by which an internal crack is formed. Regarding the difference in length among the internal cracks when a workpiece is the silicon substrate 10, as long as the length of an internal crack remains within the range of 10–200 μm, there is the tendency that the deeper the location of an internal crack from the top surface 11 of the silicon substrate 10, the longer the internal crack.

The internal processing of the silicon substrate 10 is to be carried out so that during the formation of the internal cracks 12c in the adjacencies of the top surface 11 of the silicon substrate 10, they do not progress to the top surface 11 where the superficial scratch 11a is present. Any of such processing conditions under which the internal cracks 12, which have been formed, grow and reach the top surface 11, in the adjacencies of the convergence point A, due to the heat or the like from the beam of laser light, is not to be selected. If the internal crack 12 reaches the top surface 11, the debris from the internal processing spews out of the crack 12 and spreads over the top surface, causing such problems as logic element contamination or the like.

Figure 17:
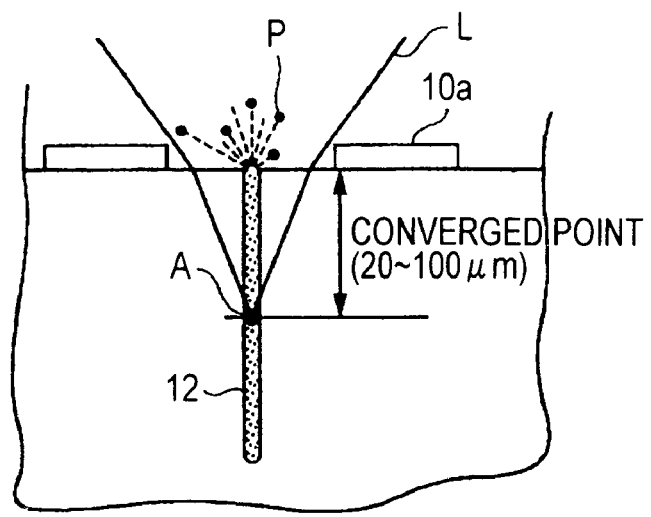
FIG. 17 is a schematic drawing for depicting how a crack progresses from the internal point of the substrate to which a beam of laser light is made to converge, toward the bottom and top surfaces of the substrate.
Figure 18:
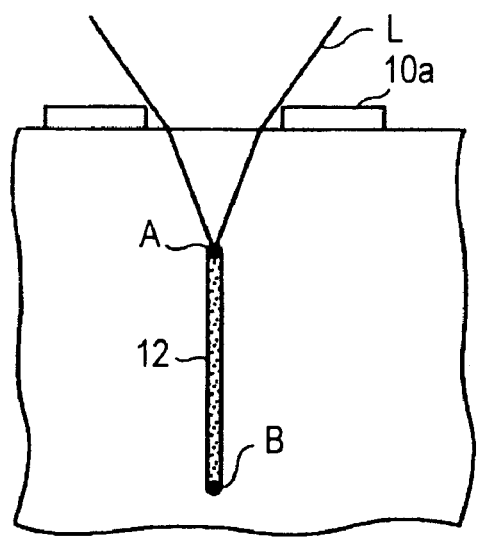
FIG. 18 is a schematic drawing showing the state of a crack which is progressing only toward the bottom surface of the substrate from the internal point of the substrate to which a beam of laser light is made to converge.
Figure 19:
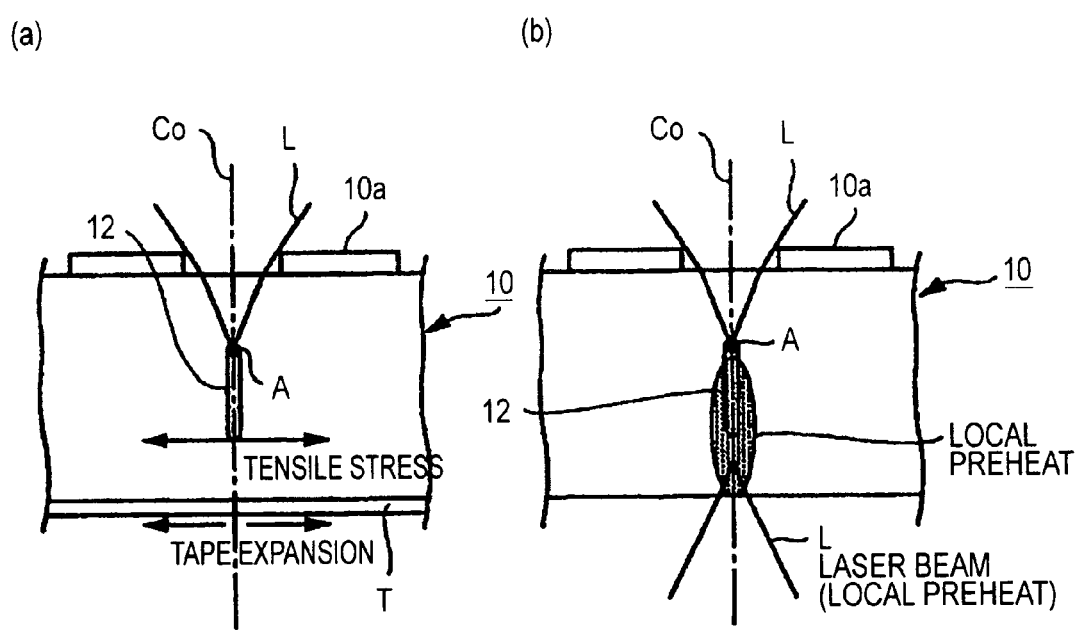
FIG. 19 is a schematic drawing for describing the method for causing a crack to progress only toward the bottom surface of the substrate from the internal point of the substrate to which a beam of laser beam is made to converge.

One of the methods for preventing such problems is to select the processing condition under which the cracks progresses downward (direction to move away from top surface 11) from the convergence point A, for the following reason. That is, the convergence point A virtually coincides with the point from which the internal crack develops. Therefore, the selection of this processing condition makes it possible to precisely control in position the progressing tip of the crack 12 relative to the top surface 11. Also, it minimizes the effects of the changes in the progression of the crack 12, upon the top surface 11, if the changes happen to occur. In comparison, if the internal crack 12 progresses upward from the convergence point A, it is possible that as changes occur to the progression of the internal crack 12, the crack will reach the top surface 11. FIG. 17 depicts the case in which the internal crack 12 progressed upward, that is, toward the entry point of the beam of laser light L, as wall as downward. The convergence point A in FIG. 17 was set to be 10–100 μm deep from the top surface 11, in order to prevent the top surface 11 of the silicon substrate 10 from being damaged during the internal processing of the silicon substrate 10, and also, to make it easier to split the silicon substrate 10. If the internal crack 12 progresses upward from this convergence point A, the progressing tip of the internal crack reaches the top surface 11 as shown in FIG. 17, and allows the debris from the internal processing to spew out onto the top surface, under a certain condition under which a beam of laser light L is made to converge to the silicon substrate 10. In this embodiment, therefore, the internal crack 12 is formed so that the progressing tip of the internal crack 12 will be on the bottom side of the silicon substrate 10 with reference to the light convergence point A, in other words, the theoretical point B to which the internal crack 12 is to finally reach will be on the opposite side of the light convergence point A from the silicon substrate surface at which the beam of laser light L enters the silicon substrate 10, as shown in FIG. 18. As for one of the practical methods to realize this process, all that is necessary is to generate tensional stress in the silicon substrate 10, on the opposite side of the light convergence point A from the silicon substrate surface at which the beam of laser light L enters the silicon substrate 10. More concretely, there are the method in which the silicon substrate 10 is internally processed while creating tensional stress in the silicon substrate 10, on the opposite side from the light convergence point A from the point at which the beam of laser light L enters the silicon substrate 10, by stretching the dicing tape T, as shown in FIG. 19(a), and the method in which the progression of the internal crack 12 is enhanced by creating thermal stress in the bottom side of the silicon substrate 10 by illuminating the point on the bottom surface of the silicon substrate 10, which corresponds in position to the internal crack 12, with a beam of such laser light that is easily absorbed by the silicon substrate 10, as shown in FIG. 19(b).

The advantages resulting from the above described processing method of limiting the direction in which the internal crack 12 is allowed to progress from the light convergence point A, to the direction (downward) for causing the internal crack 12 to progress away from the point of the entry of the beam of laser light L is as follows: Assuming that the above described two processing methods are used to cause a crack to progress to the same point, this processing method makes it possible to set the distance from the light convergence point A to the bottom end B of the internal crack 12 to be longer than that when the processing method which allows the internal crack 12 to progress both upward and downward from the light convergence point A (FIG. 17) is used. Therefore, this processing method makes it possible to position the light convergence point A closer to the top surface 11, making it therefore possible to reduce the size of the area of the top surface 11 illuminated by the beam of beam of laser light L, which is equivalent to the horizontal cross section of the beam of laser light L at the top surface 11. Therefore, this processing method can reduce the amount of the "eclipse" (phenomenon that amount by which laser light reaches light convergence point in substrate is reduced by reflection) caused by the logic circuits and nozzle layers 3, and therefore, it can internally process the silicon substrate 10 with greater efficiency.

Referring to FIG. 16(a), in terms of the thickness direction of the silicon substrate 10, the internal crack 12 may be discontinuous, comprising a plurality of smaller cracks, for example, 12a–12c, or continuous. Further, in terms of the direction in which the silicon substrate 10 is scanned by the beam of laser light L, the plurality of internal cracks 12 may be discontinuous, with the presence of a relatively large interval between the adjacent two internal cracks as shown in FIG. 16(b), or being virtually in contact with each other as shown in FIG. 16(c).

The group of internal cracks 12, which is closest to the top surface 11 of the silicon substrate 10, is located at the depth of 10–100 μm from the top surface 11, and is not in contact with the superficial scratch 11a.

Therefore, as the position of the light convergence point A is set, the oscillation setting for outputting a beam of laser light is altered when processing the internal portion of the silicon substrate 10 corresponding to the set light convergence point A; the power and frequency are selected based on the data (crack length) obtained in advance. Further, the speed at which the stage is moved needs to be altered in accordance with the selected power and frequency, in order to keep constant the energy density.

When the silicon substrate 10 is internally processed with the pulse width set to a value in the range of 15–1,000 nsec, and the energy level set to a value in the range of 2–100 μJ, the length of the resultant internal crack 12 is in the range of 2–100 μm. Thus, an internal crack with a predetermined length can be formed by selecting a proper laser oscillation condition.

As for the formation of the three groups of internal cracks 12, that is, the group of internal cracks 12a, group of internal cracks 12b, and group of internal cracks 12c, which are directly below of the intended splitting line C and are different in depth, they are formed with the use of the above described processing method, while controlling (selecting) the intensity of the beam of laser light L, so that the internal crack 12c which is closest to the top surface 11 becomes less in length than the other two internal cracks 12a and 12b. The reason for selecting the processing condition under which the internal crack 12c will be formed to be shorter than the internal cracks 12a and 12b is to prevent the problem that during the formation of the group of internal cracks 12c, aberrant internal cracks 12c reach the top surface 11 of the silicon substrate 10 by chance, and contaminate the top surface 11.

In order to ensure that the group of internal cracks 12c, which will connect to the superficial scratch 11a during the splitting of the silicon substrate 10, which will be described later, the group of internal cracks 12 is desired to be formed as closely as possible within the range in which it does not connect to the superficial scratch 11a by chance during the internal processing of the silicon substrate 10.

In other words, in order to prevent the accidental problem that during the superficial or internal processing of the silicon substrate 10, aberrant cracks 12c reach the top surface 11 of the silicon substrate 10 by chance, and contaminate the top surface 11, it is desired that a certain amount of gap is provided between the superficial scratch 11a and the group of internal cracks 12c located immediately below the 11a.

Figure 20:
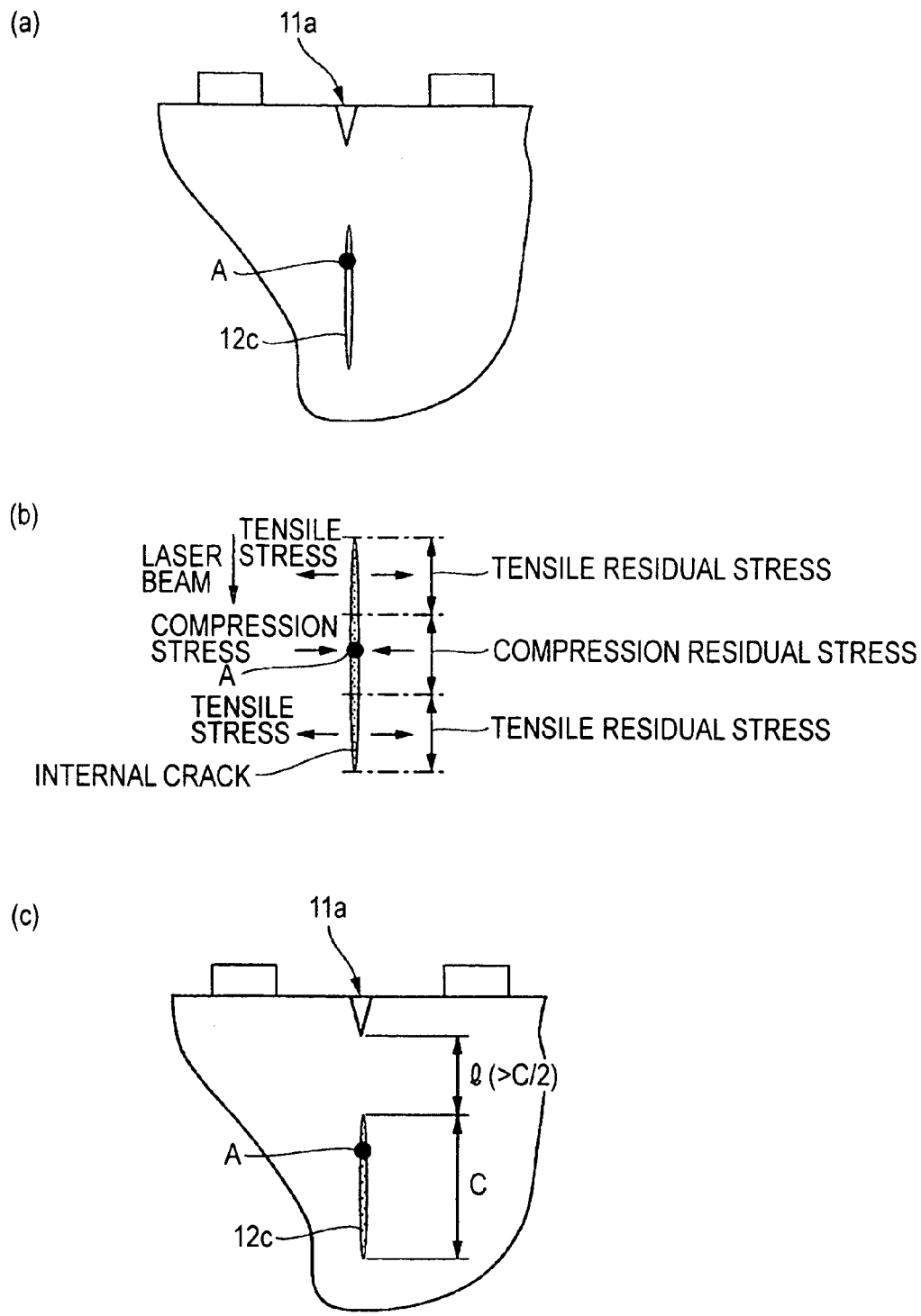
FIG. 20 is a schematic drawing for describing the positional relationship between the scratch (groove) formed in the top surface and the corresponding internal crack.

Referring to FIG. 20(a), there is the tendency that when the internal crack 12c is formed directly below the superficial scratch 11a, the distance by which it grows downward from the light convergence point A is greater than the distance by which it grows upward. In an extreme case, the internal cracks 12c grows only downward from the light convergence point A. The reason for such an occurrence seems to be as follows. That is, when forming the group of internal cracks 12 closer to the top surface 11 of the silicon substrate 10, the beam of laser light L is affected by the silicon substrate 10 (reflected by top surface 11 or absorbed by silicon substrate 10). As a result, the portion of the energy, which would have caused the internal crack 12 to grow upward from the light convergence point A, is partially lost at the top surface 11. Consequently, the internal crack 12c does not grow into the portion of the silicon substrate 10 between the top surface 11 and the light convergence point A for forming the internal crack 12c, even though this portion is in the path of the beam of laser light L which is high in energy density.

The studies made by the inventors of the present invention and different from the above quoted ones reveals that there remains residual tensional stress in the silicon, in the adjacencies of the top ⅓ of the crack 12, (portion closer to point of laser beam entry) (FIG. 20(b)). This residual tensional stress works in the direction to widen the internal crack 12. Thus, the presence of this residual tensional stress, which potentially widens the internal crack 12c in the direction perpendicular to the direction in which the internal crack 12c grew, in the portion of the silicon substrate 10 between the internal crack 12c and top surface 11, that is, the portion into which the internal crack 12c did not progress, makes it easier for the internal crack 12c to connect to the superficial scratch 11a, making it therefore possible for the internal crack 12c to unexpectedly progress to the superficial scratch 11a.

Further, it is also possible that this unexpected growth of the internal crack 12c to the superficial scratch 11a will occur during the internal processing of the silicon substrate 10 which is carried out after the superficial processing of the silicon substrate 10 as in this embodiment, and contaminates the top surface 11. In comparison, if the superficial processing of the silicon substrate 10 is carried out after the internal processing of the silicon substrate 10, there is the possibility that an undesirable crack such as the one shown in FIG. 38 will develop to the top surface during the superficial processing of the silicon substrate 10.

Referring to FIG. 20(a), as for the means for preventing these problems, the depth of the light convergence point A, and the conditions under which the silicon substrate 10 is processed with the beam of laser light L, have only to be set so that the distance l from the internal crack 12c to the superficial scratch 11a, and the length c of the internal crack 12c in terms of the thickness direction of the silicon substrate 10, satisfies the following relationship:

$l>c/2$.

This relationship was obtained as the result of the studies made by the inventors of the present invention, and the inferences drawn by the inventors from the studies.

More specifically, in the area of the silicon substrate 10 between the internal crack 12c and top surface 11 of the silicon substrate 10 in FIG. 20(a), there is a portion, such as the portion in the adjacencies of the top portion of the internal crack 12c, shown in FIG. 20(b), in which tensional stress remains. Therefore, this portion, which is above the internal crack 12c, is easily crack due to the presence of the residual tensional stress effected by the beam of laser light L. It seems that the thickness of this portion is roughly 0.5 time the length of the internal crack 12c in terms of the thickness direction of the silicon substrate 10.

Figure 38:
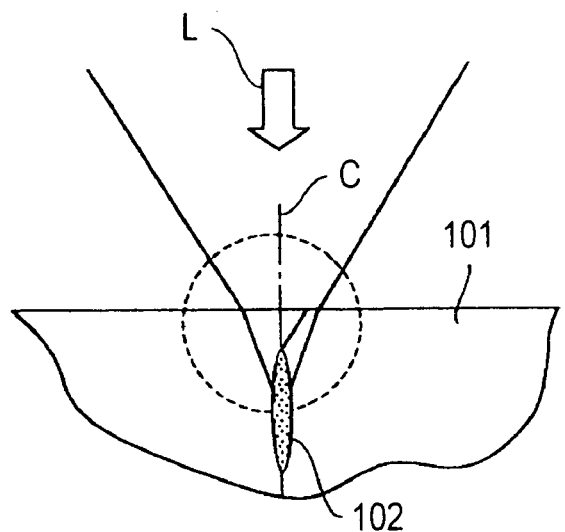
FIG. 38 is a schematic drawing for describing the method, in accordance with the prior art, for splitting a substrate.
Figure 38:
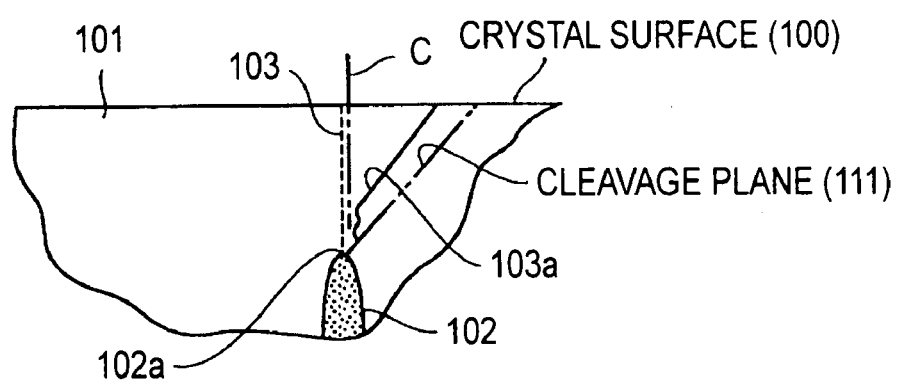

It has been experientially known that if the superficial scratch 11a and internal crack 12c are formed so that the inequality: l>c/2 is satisfied, undesirable cracks, such as those shown in FIG. 38, which do not connect to the bottom of the superficial scratch 11a, are not likely to develop until the splitting of the silicon substrate 10.

In order for the group of internal cracks 12c, which is closest to the top surface 11 of the silicon substrate 10, to be formed so that it meets the abovementioned requirements, it is to be positioned at a depth in the range of 10–100 µm from the top surface 11, so that it does not accidentally connect to the superficial scratch 11a.

Figure 21:
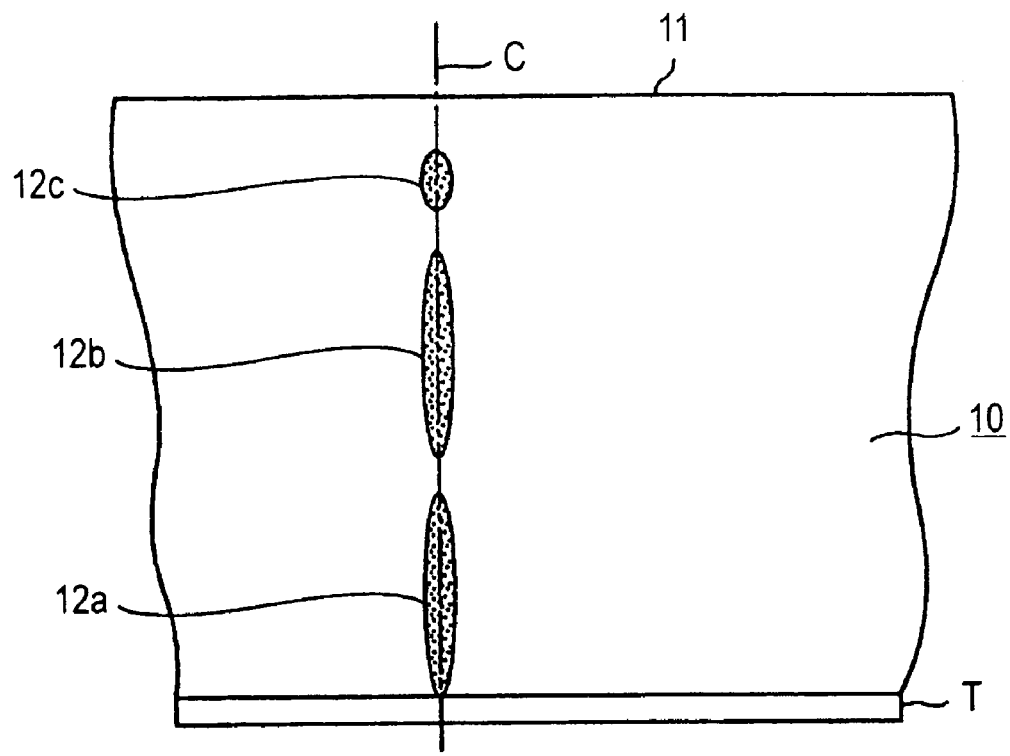
FIG. 21 is a schematic drawing for describing the case in which the internal crack has progressed to the bottom surface of the silicon substrate.

In comparison, the group of internal cracks 12a and group of internal cracks 12b are not likely to cause the surface contamination. Therefore, the internal cracks 12a and 12b do not need to be as precise in length as the internal crack 12c. Rather, in order to reduce the amount of the stress which has to be created in the silicon substrate 10 when splitting the silicon substrate 10, control is executed with the use of the above described method so that the cracks 12a and 12b grow to a relatively greater length than the length to which the internal crack 12c is allowed to grow. In some cases, it is possible to allow the internal crack 12a, which is formed closest to the bottom surface of the silicon substrate 10, to grow to the bottom surface as shown in FIG. 21.

Next, the order in which the groups of internal cracks different in depth are formed will be described.

Figure 22:
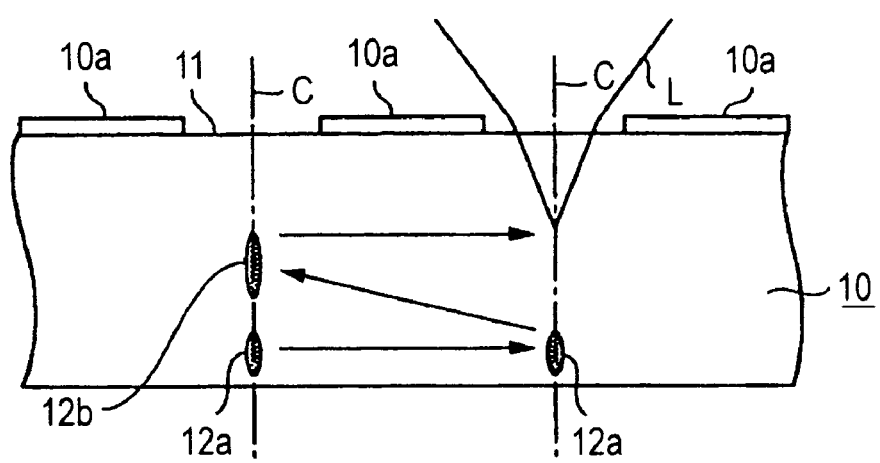
FIG. 22 is a schematic drawing for describing the order in which a plurality of cracks different in depth are formed.
Figure 22:
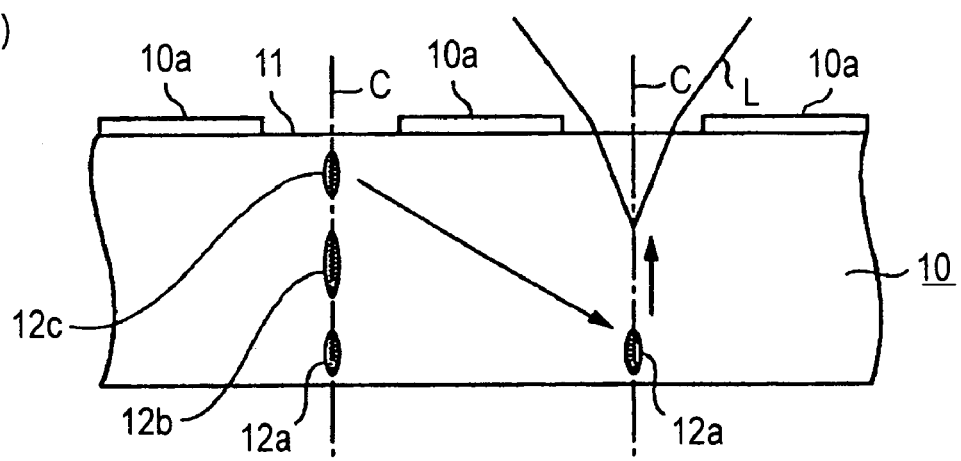

According to the first method shown in FIG. 22(a), first, a group of internal cracks, for example, internal cracks 12, is formed below a certain number of the intended splitting lines C, or all of the intended splitting lines C, so that they will be virtually at the same depth from the top surface 11 of the silicon substrate 10, and then, another group of internal cracks, for example, internal cracks 12b, which are different in depth from the group of internal cracks (internal crack 12a) formed first, is formed below the certain number of the intended splitting lines C, or all of the intended splitting lines C. In other words, the plurality of groups of internal cracks, different in depth, are formed in steps, within the silicon substrate 10. Therefore, the first method can reduce the effects of the adjacent intended splitting lines C.

According to the second method shown in FIG. 22(b), first, the group of internal cracks 12a, group of internal cracks 12b, and group of internal cracks 12c, which are different in depth, are consecutively formed below the first intended splitting line C, and the same process is repeated below the next intended splitting line C, and so on. This method can reduce the number of times the automatic focusing mechanism is activated at the process starting point, when it is necessary to adjust the position of the light convergence point according to the flatness of the silicon substrate 10.

Figure 23:
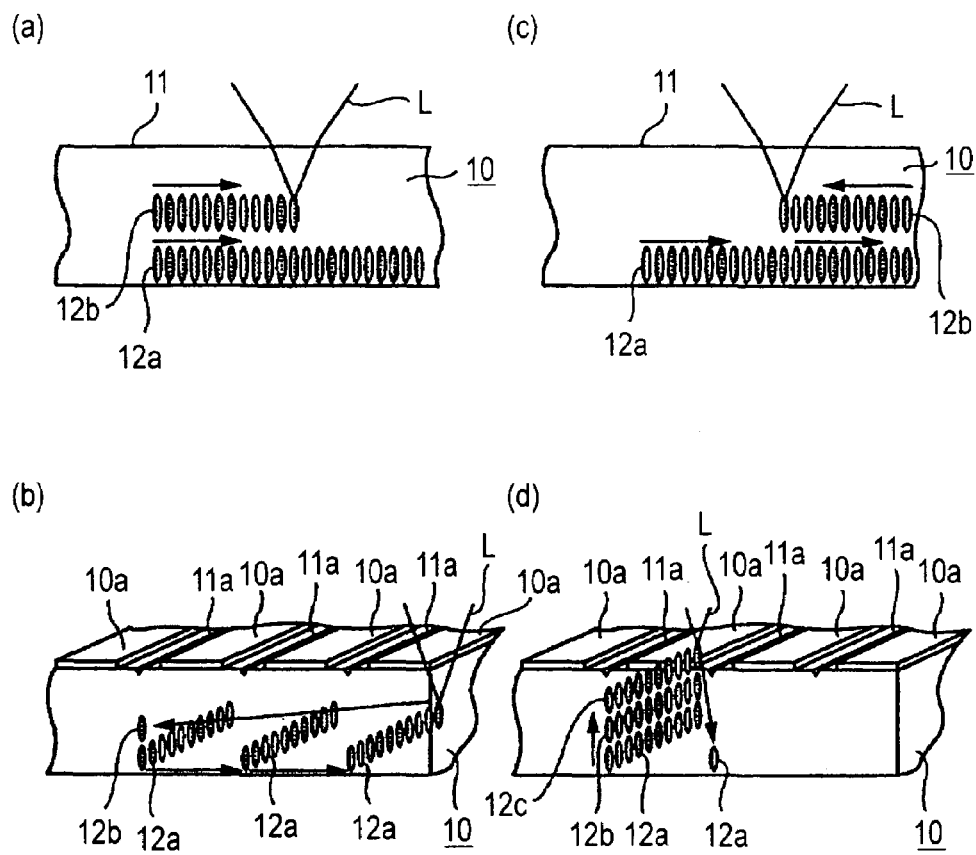
FIG. 23 is a schematic drawing for describing the method for scanning the substrate with a beam of laser light when forming a plurality of groups of cracks, each group being different in depth.

FIGS. 23(a)–23(d) are for three-dimensionally depicting the difference, in the order in which the various steps in the internal processing of the silicon substrate 10 are carried out, between the first and second processing methods. FIGS. 23(a), 23(b), and 23(c) show the first method, and FIG. 23(d) shows the second method. In FIGS. 23(a)–23(d), the internal cracks 12a, 12b, and 12c are separated. However, in order to ensure that the silicon substrate 10 is satisfactorily split, it is desired that the internal cracks 12 are connected at least in certain sections of each of the two groups of internal cracks 12, (FIG. 16(c)).

In the first method, there are two cases, in terms of the direction in which the light convergence point A is moved along the intended splitting line C: case in which the light convergence point A is moved only in one direction as shown in FIGS. 23(a) and 23(b), and case in which it is moved in two directions (one direction and then, in reverse direction) as shown in FIG. 23(c). The latter case is shorter in the overall distance by which the silicon substrate 10 is scanned, and therefore, the latter case can reduce the length of the time necessary for processing the silicon substrate 10.

In this embodiment, the latter case is selected. However, which case is to be selected should be determined based on the comprehensive study of the state of the silicon substrate 10 (parallelism and twist of silicon substrate 10).

Referring to FIG. 3, when there are two or more intended splitting lines C1, and two or more intended splitting lines C2 intersectional to the splitting lines C1, there are points (intersections C12) at which the splitting lines C1 and C2 intersect with each other. In the adjacencies of each intersection C12, when the beam of laser light L is moved along the second splitting line C2 to internally process the silicon substrate 10 at the same depth as that at which it was moved along the first splitting line C1, after the formation of the group of internal cracks below the first splitting line C1, the beam of laser light L is blocked by the group of internal cracks formed below the first splitting line C1. This phenomenon is a local phenomenon; it does not occur across the entire portion of the silicon substrate 10 below the second splitting line. However, it is desired that while moving the beam of laser light L along the second splitting line, the processing condition is altered in the adjacencies of the intersection C12, in consideration of energy loss, or that before starting scanning in the second splitting direction, the processing condition is altered, for example, the illumination energy is increased, so that when the silicon substrate 10 is processed in the second splitting direction, the silicon substrate 10 is processed under the condition different from that under which the silicon substrate 10 is processed in the first splitting direction.

[Fracturing and Splitting Process]

After the formation of the superficial scratch 11a on the top surface 11 of the silicon substrate 10 following each of the intended splitting line, and the formation of the group of internal cracks 12a, group of internal cracks 12b, and group of internal cracks 12c, below each of the superficial scratches 11a, in the silicon substrate 10, there is no connection between the superficial scratch 11a, and the group of internal cracks 12c, or the group closest to the corresponding superficial scratch 11a of the three groups of internal cracks 12. Therefore, after the processing of the silicon substrate 10 by the beam of laser light L, the individual logic elements 10a on the silicon substrate 10 have not separated from the silicon substrate 10. Therefore, there is no possibility that a piece or pieces, for example, semiconductor element chips or the like, into which the object (silicon substrate 10) is to be split, will fall off from the object to be split. Further, the positional deviation of a piece or pieces of the object to be split, which interferes with the application of external force, does not occur during the splitting of the object.

The silicon substrate 10 in the above described state is split and separated in the following order.

Figure 24:
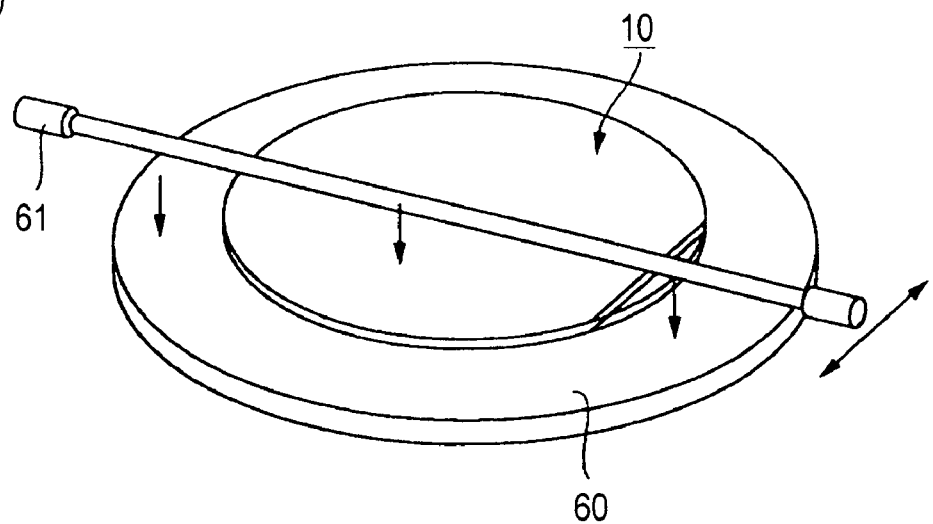
FIG. 24 is a schematic drawing for describing the process of splitting the substrate with the use of a roller.
Figure 24:
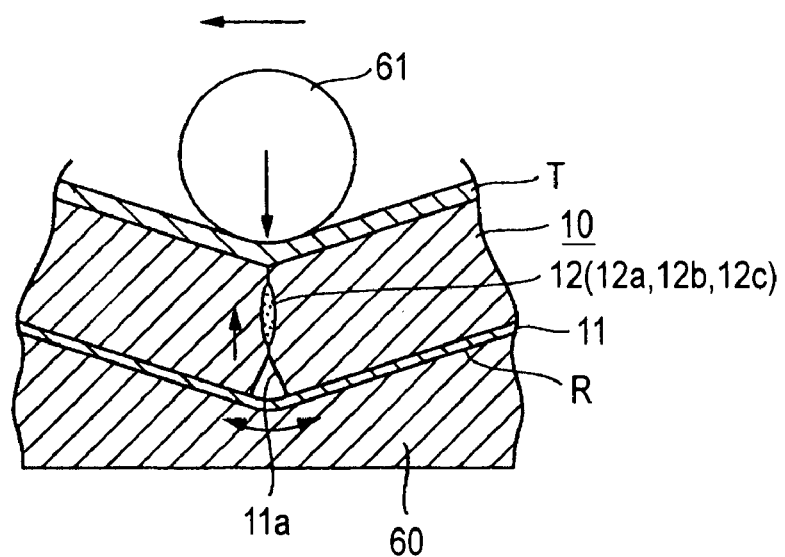

Referring to FIG. 24, after the formation of the superficial scratches 11a and internal cracks 12 (12a, 12b, and 12c), the silicon substrate 10 is placed on an elastic rubber sheet 60 of a splitting apparatus so that its bottom surface faces upward, while remaining mounted on the dicing tape T. The elastic rubber sheet 60 is formed of silicone rubber, fluorinated rubber, or the like. In order to prevent the problem that as the top surface 11 of the silicon substrate 10 comes into contact with the rubber sheet 60, contaminants adhere to the top surface 11, a piece of commercially available protective tape R, which is used for back grinding or the like, may be pasted to the top surface 11 of the silicon substrate 10 after the formation of the internal cracks 12.

The silicon substrate 10 is split by pressuring the silicon substrate 10 with a stainless steel roller 61, through the dicing tape T. More specifically, first, the silicon substrate 10 is to be placed on the rubber sheet 60 so that one of the intended splitting lines C on the silicon substrate 10, preferably, the splitting line C parallel to the aforementioned first splitting direction, becomes roughly parallel to the axial line of the roller 61. Then, the silicon substrate 10 is to be pressured by the roller 61 while rolling the roller 61 on the silicon substrate 10. As the silicon substrate 10 is pressured, the portion of the rubber 60 directly below the roller 61 deforms in a manner of sinking. As a result, stress is created in the silicon substrate 10, which acts in the direction to stretch the top side of the silicon substrate 10, that is, the rubber sheet side of the silicon substrate 10. This stress acts on the weakest areas of the top surface 11; in other words, it functions to widen the superficial scratches 11a, which coincide with the intended splitting lines C1.

As a result, cracks develop from the superficial scratches 11a, and connect to the internal cracks 12a, 12b, and 12c formed by the internal processing of the silicon substrate 10 by focusing the beam of laser light L thereto. Thus, the cracks become continuous from the top surface to the bottom surface of the silicon substrate 10. In other words, the silicon substrate 10 is split along the intended splitting line C1. As for the progression of the cracks, the cracks occur following the crystalline orientation of the silicon substrate 10. However, the splitting of the silicon substrate 10 occurs as the cracks connect to the superficial scratches 11a, and therefore, it does not occur that the silicon substrate 10 splits along a line substantially offset from the intended splitting line C1; each crack develops through the portion of the silicon substrate 10, within the width range of each superficial scratch 11a. With the progression of the roller 61 across the silicon substrate 10, the silicon substrate 10 is split at each intended splitting line C1 parallel to the first splitting direction. As for the direction in which the roller 61 is rolled, either the method in which the roller 61 is rolled from one point of the edge of the silicon substrate 10 to the opposite point of the edge, or the method in which the silicon substrate 10 is pressed by rolling the roller 61 from the center portion of the silicon substrate 10 toward the edge, may be used.

Next, the silicon substrate 10 is to be rotated by 90° so that the intended splitting lines C2 parallel to the second splitting direction become roughly parallel to the axis of the roller 61. Then, the silicon substrate 10 is to be pressured by the roller 61, as it was when the silicon substrate 10 was split in the first splitting direction, so that cracks develop from the superficial scratches 11a parallel to the second splitting direction, and reach the bottom surface of the silicon substrate 10.

Figure 25:
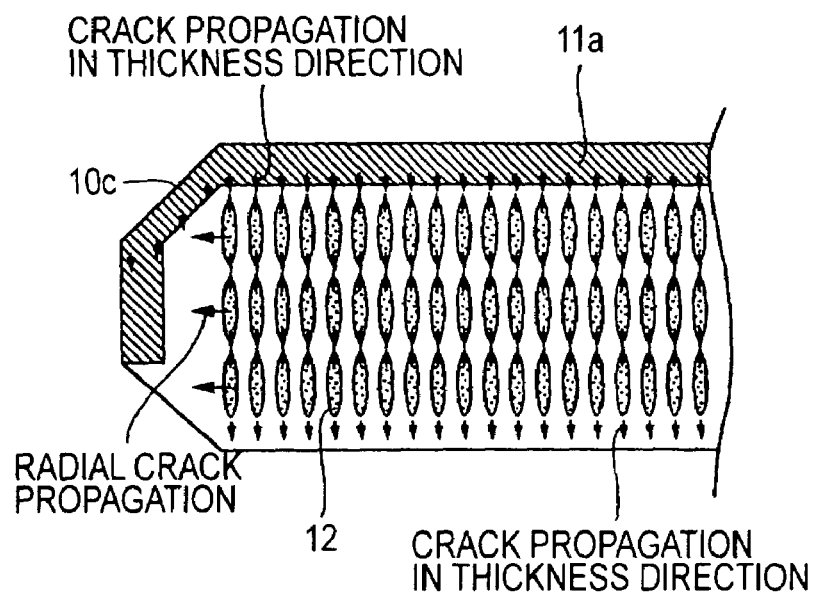
FIG. 25 is a schematic drawing for describing the relationship between the chamfered edge of the silicon substrate, and the direction in which the cracks progress.

As for the progression of the crack toward the periphery of the silicon substrate 10, it begins from a single or plural portions of the silicon substrate 10, which are next to, and on the inward side of, the slanted surface 10c resulting from the chamfering, and progresses along the intended splitting line C1. As for the progression of the crack through the portion of the silicon substrate 10 corresponding to the slanted surface 10c, or the chamfered portion of the silicon substrate 10, which has no internal crack, it is guided by the superficial scratch 11a as shown in FIG. 25. In other words, even the portion of the silicon substrate 10, which corresponds to the slanted surface 10c resulting from the chamfering, will properly split, that is, it splits along the theoretical extension of the superficial scratch 11a.

Through the above described process, the silicon substrate 10 is split into a plurality of individual element chips (logic elements 10a).

In the splitting process shown in FIG. 24, the stress resulting from the deformation of the rubber sheet 60 caused by the hard roller 61 is made to act on the top surface portion the silicon substrate 10. Thus, in order to prevent the problem that the logic elements 10*a* and nozzle layers 3 are damaged during this process, the amount of load applied to the silicon substrate 10 by the roller 61, and thickness and hardness of the rubber sheet 60, must be properly selected. Further, in order to prevent the dicing tape T and surface protecting tape R from interfering with the splitting of the silicon substrate 10, their materials and thicknesses must also be properly selected.

As for the means for evenly pressuring the silicon substrate 10 along a straight line from its bottom side, it does not need to be limited to a roller. For example, it may be a tool in the form of a blade such as the one disclosed in Japanese Laid-open Patent Application 2003-334675.

In the case of the silicon substrate splitting method which presses the silicon substrate 10 across a straight line with the use of such a tool as a roller or blade, the tool is placed roughly parallel to the directing in which the silicon substrate 10 is to be split (roller is positioned so that its axis becomes roughly parallel to silicon substrate splitting direction), so that as the pressure is applied to the tool in contact with the silicon substrate 10 along a given intended splitting line, the applied pressure is concentrated to the portion of the silicon substrate 10 corresponding to the intended splitting line. Therefore, the usage of this silicon substrate splitting method ensures that the silicon substrate 10 is precisely split.

In the case of the silicon substrate 10 in which the group of internal cracks closest to the bottom surface of the silicon substrate 10 are extended to the bottom surface of the silicon substrate 10, or the proximity of the bottom surface, the position of the group of internal cracks can be visually recognized with the use of a microscope. Thus, if this group of internal cracks is used as the reference for placing the pressing means on the silicon substrate 10 in parallel to the intended splitting line, it is ensured that the pressure is applied to the silicon substrate 10 along the intended splitting line. In other words, this group of internal cracks can be made to contribute to the precise splitting of the silicon substrate 10.

As for the selection of the method for splitting the silicon substrate 10 having the silicon substrate 10*a* and internal cracks 12 with the application of external force along the intended splitting line, it may be either of the following two methods.

Figure 26:
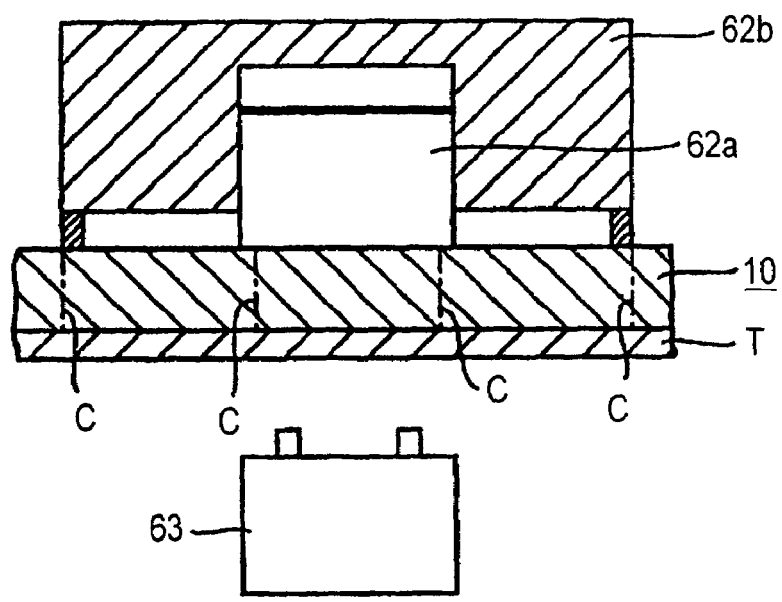
FIG. 26 is a schematic drawing for describing the process of splitting the substrate with the use of a collet.

Referring to FIG. 26, the first method is as follows: the logic element 10*a* is separated along the intended splitting line C by creating bending stress in the silicon substrate 10 along the intended splitting line C between the adjacent two logic elements 10*a*. More specifically, the logic element 10*a*, which is to be separated is held between a collet A62*a* placed in contact with the top surface of the logic element 10*a*, and a pin 63 placed on the bottom side of the logic element 10*a*, and then, is pushed upward. In order to prevent the adjacent logic elements 10, that is, the logic elements 10*a*, located next to the logic element 10*a* to be moved upward, from being moved upward with the logic element 10*a* to be moved upward, the adjacent logic elements 10*a* are held down by a collet B62*b*. Therefore, as the center logic element 10*a*, or the logic element 10*a* to be moved upward, is pushed upward, such stress that acts to widen the superficial scratch 11*a* which coincides with the intended splitting line C is generated in the silicon substrate 10. As a result, a crack develops inward of the silicon substrate 10 from the superficial scratch 11*a*, connects to the internal crack 12, and reaches the bottom surface of the silicon substrate 10.

Figure 27:
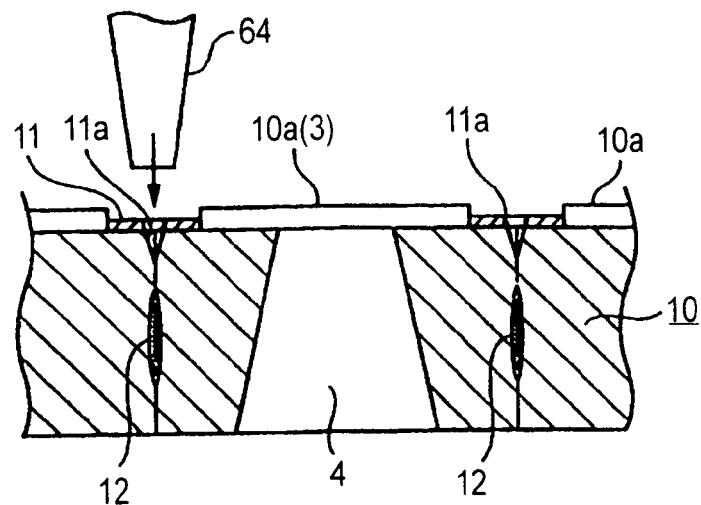
FIG. 27 is a schematic drawing for describing a case in which the substrate is split by delivering shock to the substrate with a tool.

As for the second method, referring to FIG. 27, it directly delivers mechanical shock to the top surface of the silicon substrate 10. More specifically, after the formation of the superficial scratches 11*a* on the top surface of the silicon substrate 10, and internal cracks 12 in the silicon substrate 10, the silicon substrate 10 is conveyed to a single-point bonder. Then, shock is continuously delivered to the silicon substrate 10, on the top surface 11, preferably, on the areas in the adjacencies of the superficial scratch 11*a*, with the use of a hard and minute tool 64. As a result, a crack develops inward of the silicon substrate 10 from the superficial scratch 11*a*, connecting thereby the superficial scratch 11*a* with the internal crack 12.

Further, after processing the silicon substrate 10 with the use of a laser, the silicon substrate 10 may be split by delivering thermal shock to the silicon substrate 10. In this case, the amount of the heat applied to the silicon substrate 10 must be within the range in which the logic elements 10*a* are not adversely affected. This method does not directly apply external mechanical force to the silicon substrate 10, and therefore, does not harm the logic elements 10*a*.

[Touching-up Process]

Figure 28:
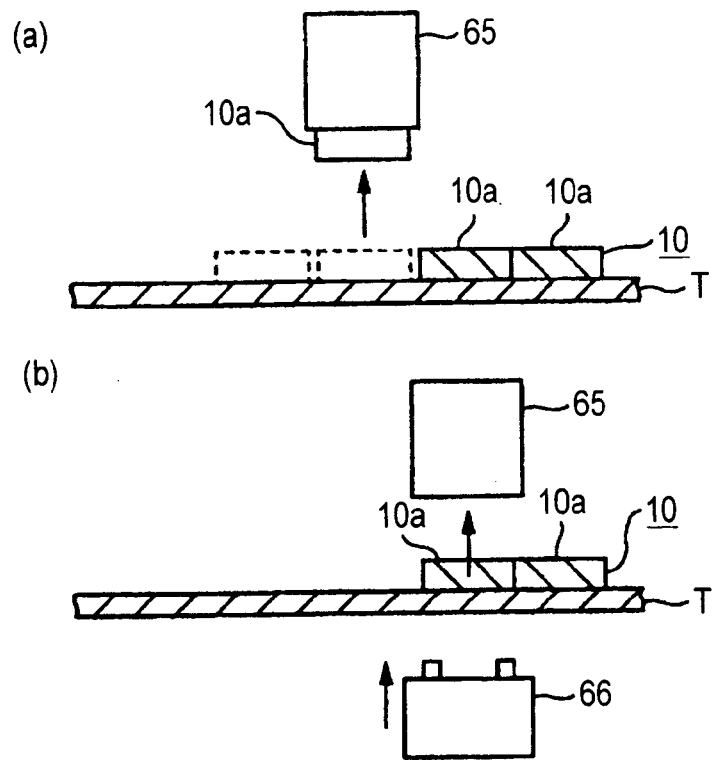
FIG. 28 is a schematic drawing for describing the repairing process.

While the superficial scratches 11*a* are connected to the internal cracks 12 by the cracks which are developed between them in the splitting process, another crack develops from the bottom end of the internal crack 12 and reaches the bottom surface of the silicon substrate 10. As a result, the silicon substrate 10 is split into a plurality of individual element chips 10*a*. If a certain section, or sections, of the silicon substrate 10 fail by chance to completely split, these sections must be subjected again to the splitting process. As for the method for splitting the sections of the silicon substrate 10, which failed to completely split, external force is applied only to the logic element 10*a* which failed to separate from the adjacent one, in order to completely separate it from the adjacent one, with the use of a mechanism such as the one shown in FIG. 28.

[Picking-up Process]

After the silicon substrate 10 is split into the plurality of logic elements 10*a* through the splitting process and touching-up process, the logic elements 10*a* are collected by a collecting mechanism such as a suction collet 65, a pickup pin 66, and the like, and are individually stored. During this process, the gaps among the elements 10*a* may be expanded with the use of an expander, so that even if the silicon substrate 10 has a few sections across which the silicon substrate 10 failed to be fully split, these sections will be split, and also, so that the collecting mechanism is allowed to pick up each logic element 10*a* without coming in contact with the adjacent logic elements 10*a*. Also during the process, the powdery dust which is generated when the logic elements 10*a* are picked up may be vacuumed away, in order to prevent the function of the logic circuits, ink ejection nozzles, etc., from being adversely affected by the adhesion of the powdery dust thereto.

Each of the lateral surfaces of each of the element chips yielded by splitting the silicon substrate 10, that is, the surface of the element chip which resulted due to the splitting of the silicon substrate 10, comprise the internal surface of the superficial scratch 11*a* (at least a part of internal surface of superficial scratch 11*a*), one of the opposing surfaces of each of the plurality of internal cracks 12 which were aligned in the thickness direction of the silicon substrate 10, that is, such surfaces that resulted as the portions of silicon melted to form the internal cracks cooled down, and one of the opposing surfaces of the cracks which connected these internal cracks 12. The visual examination of the lateral surface of the element chip 10a revealed that the portion of the lateral surface, which corresponds to the internal crack 12 and the crack formed to split the silicon substrate 10, is smoother than the portion of the lateral surface, which corresponds to the superficial scratch 11a; the latter has very small irregular peaks and valleys.

The superficial scratch 11a can be formed with the use of a beam of laser light. However, if the superficial scratch 11a is formed with the use of a beam of laser light, the lateral surface of the resultant element chip 10a will comprise such a surface that results as a melted portion of silicon cools down.

If the top surface of the silicon substrate 10 as an object to be split is structured so that it interferes with the process in which the inside of the silicon substrate 10 is illuminated with a beam of laser light L, the silicon substrate 10 may be illuminated with the beam of laser light L from the bottom side of the silicon substrate 10 in order to internally process the silicon substrate 10. Further, if the top surface of the silicon substrate 10 is rough, it may be smoothed by etching or the like treatment, across the area through which the beam of laser light L is to enter the silicon substrate 10; in other words, it may be provided with a window for the beam of laser light L.

Hereinafter, the other embodiments of the present invention will be described. If a given structural arrangement in any of the following embodiments of the present invention is not described, this structural arrangement is the same in effects as that in the preceding embodiment.

(Embodiment 2)

In the case of the silicon substrate 10, the surface layer of which is a film 2 of silicon dioxide, which is different from the primary substrate material, in order to ensure that the internal cracks are reliably formed, the amount by which a beam of laser light is reflected by the surface of the silicon substrate 10 must be minimized, because the primary cause of the energy loss is that the beam of laser light L is reflected by the surface of the silicon substrate 10.

Therefore, the silicon substrate splitting process in the first embodiment is partially modified.

Figure 29:
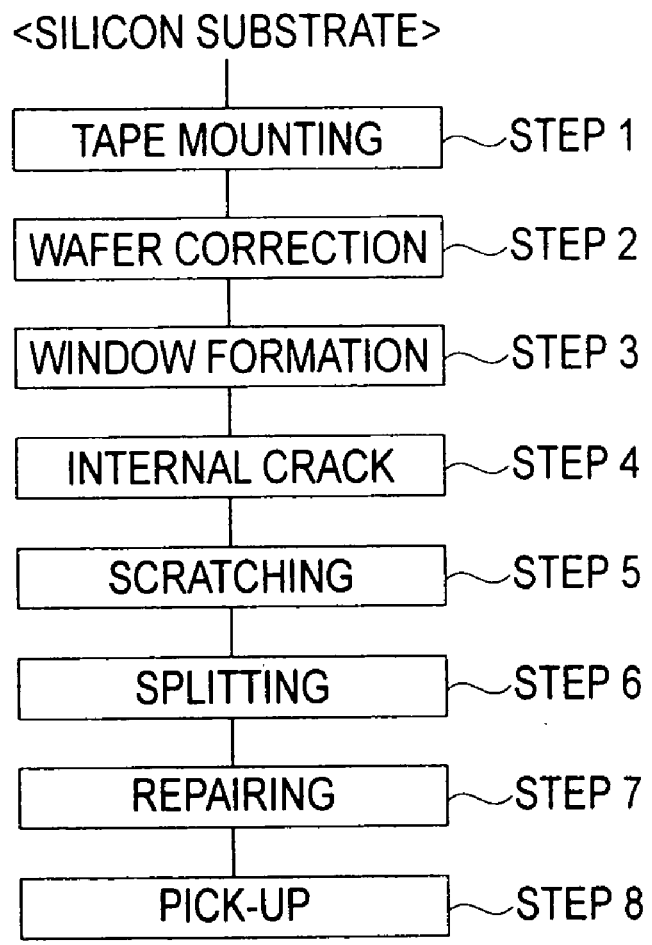
FIG. 29 is a flowchart of the substrate splitting process in the second embodiment of the present invention.

FIG. 29 is a flowchart of the silicon substrate splitting process in this embodiment. The silicon substrate splitting process in this embodiment comprises: Step 1 for mounting the silicon wafer 1 with the use of adhesive tape; Step 2 for correcting silicon wafer 1; Step 3 for forming a light projection window; Step 4 for forming internal cracks; Step 5 for forming superficial grooves; Step 6 for splitting the silicon wafer 1; Step 7 for touching up the incompletely separated element chips; and Step 8 for collecting the separated element chips 10a.

Figure 30:
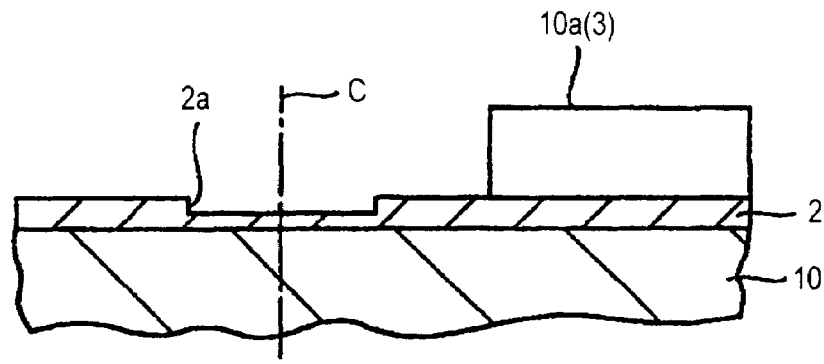
FIG. 30 is a schematic drawing for showing the groove (recess) formed in the top surface of the oxide film by etching.
Figure 31:
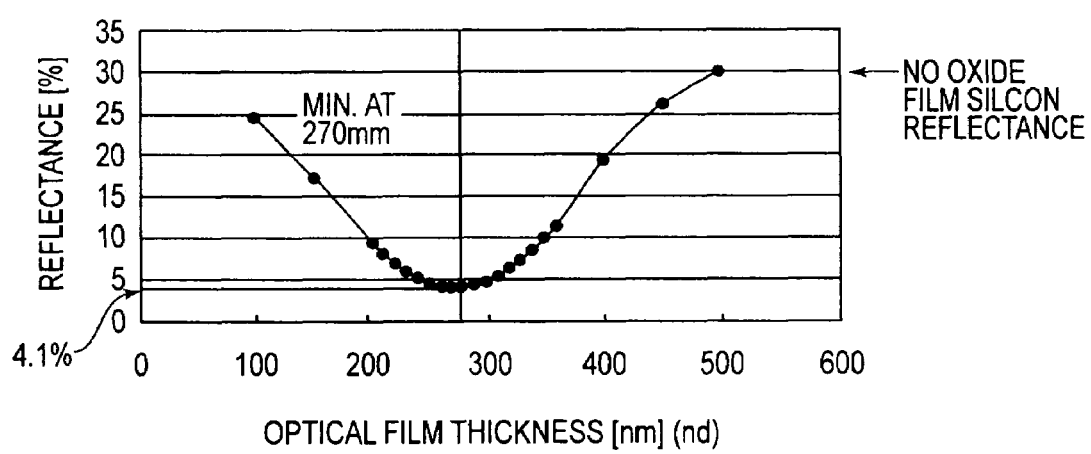
FIG. 31 is a graph showing the relationship between the thickness and reflectance of the oxide film.

Referring to FIG. 30, in the Step 3 for forming the laser light projection window, in order to make the energy of the beam of laser light emitted in Step 4 efficiently converge, a groove 2a for optimizing the thickness of the oxide film 2 of the silicon substrate 10 is formed. FIG. 31 is a graph which shows the relationship between the thickness and reflectance of the silicon dioxide film 2. Based on this graph, the thickness for the oxide film 2, which minimizes the reflectance of the oxide film 2 relative to the beam of laser light L is selected.

More specifically, when the light source is the fundamental wave (1,064 nm in wavelength) of the YAG laser, and nd=270 nm (roughly λ/4), the reflectance is smallest, being roughly 4% (FIG. 31). Thus, the groove 2a is formed by etching or the like method, in the top surface of the oxide film 2 so that the thickness of the groove portion of the oxide film becomes this value. Needless to say, the groove 2a is formed by etching, in the surface of the oxide film 2, through which the beam of laser light L is made to converge inside the silicon substrate 10 to form cracks within the silicon substrate 10.

Instead of forming the groove 2a in the surface of the oxide film 2, the oxide film 2 itself may be formed to the optimal thickness.

The internal cracks are formed by causing the beam of laser light L to converge in the silicon substrate 10 through the portion of the oxide film 2 with the optimal thickness. Then, the superficial scratches 11a are formed in the top surface of the silicon substrate 10, following the intended splitting lines, by scoring the top surface with the use of nonthermal method, for example, with the use of a carbide or diamond tipped scriber, or the like. This process of forming the superficial scratches 11a may be carried out before the silicon substrate 10 is internally processed by the beam of laser light.

According to this embodiment, the amount by which the energy of the beam of laser light is lost because the beam of laser light is reflected by the surface of the silicon substrate 10, the surface layer of which is an oxide film, can be minimized so that the amount of the energy consumed in the process in which the internal cracks are formed can be reduced. Further, it is possible to prevent the problem that the unevenness in the thickness of the oxide film, nonuniformity in the film properties, etc., make unstable the process for forming internal cracks.

(Embodiment 3)

Figure 32:
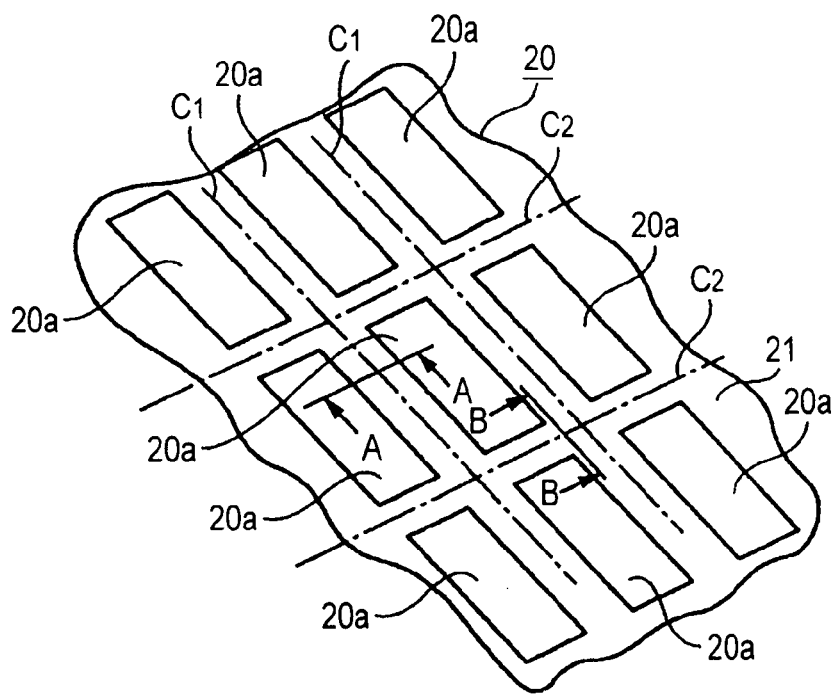
FIG. 32 is a schematic drawing for describing the third embodiment of the present invention, FIG. 32(a) being a perspective view of a part of the silicon substrate, FIG. 32(b) being a schematic drawing for showing the processed internal portions which are aligned in the direction perpendicular to the top surface of the substrate, below the intended splitting line C1 in FIG. 32(a), and FIG. 32(c) being a schematic drawing for showing processed internal portions which are aligned, perpendicular to the top surface of the substrate, below the intended splitting line C2 in FIG. 23(a).
Figure 32:
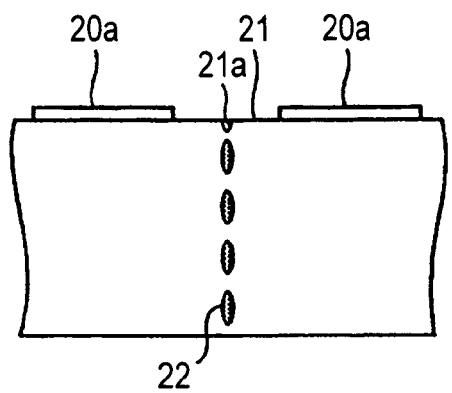
Figure 32:
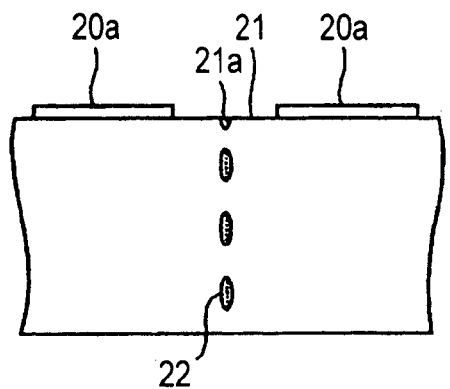

Referring to FIG. 32(a), the silicon substrate 20 in this embodiment has a plurality of logic elements 20a of an unusual shape, that is, logic elements unusually greater in the ratio between its long and short edges. When splitting this silicon substrate 20 by forming a plurality of internal cracks in the silicon substrate 20, and superficial scratch 21a in the top surface 21 of the silicon substrate 20, the frequency with which the logic elements 20a are damaged while splitting the silicon substrate 20 following the intended splitting line C1, which is parallel to the longer edges of the logic element 20a, is likely to be greater than the frequency with which the logic elements 20a are damaged while splitting the silicon substrate 20 following the intended splitting line C2.

In particular, if the silicon substrate 20 is such a silicon substrate that holds a plurality of logic elements 20a, each of which is covered with an orifice plate having a liquid ejection orifice(s), not only does such a crack that yields a logic element 20a having an undesirable peripheral contour develop, as described above, but also, a crack develops from the corner of the liquid ejection orifice to the edge of the logic element 20a. The cause for these problems is thought to be that when the silicon substrate 20 is split following the intended splitting line parallel to the longer edges of the logic element 20a, a large amount of bending stress is created in the silicon substrate 20 (logic element 20a), and the logic element 20a could not withstand this bending stress. Thus, in this embodiment, the problem that some of the logic elements 20a are damaged when the silicon substrate 20 is split following the intended splitting line parallel to the longer edges of the logic element 20a is prevented by making smaller the amount of stress generated in the silicon substrate 20 when splitting the silicon substrate 20 following the intended splitting line parallel to the long edges of the logic element 20a than the amount of stress generated in the silicon substrate 20 when splitting the silicon substrate 20 following the intended splitting line parallel to the shorter edges of the logic element 20a. All that is necessary to reduce the amount of the stress generated in the silicon substrate 20 when splitting the silicon substrate 20 following the intended splitting line parallel to the longer edges of the logic element 20a is to reduce the amount of pressure to be applied to split the silicon substrate 20 following the above-mentioned splitting line, and all that is necessary to reduce the amount of the pressure to be applied to split the silicon substrate 20 following the abovementioned splitting line is to form the internal cracks so that the difference (unprocessed portion of silicon substrate 20 in terms of thickness direction of silicon substrate 20) between the sum of the lengths of all the cracks aligning in the thickness direction of the silicon substrate 20, below a given intended splitting line, and the thickness of the silicon substrate 20, becomes smaller.

Thus, for example, when forming the groups of internal cracks 12 along the intended splitting line C2, which is parallel to the shorter edges of the logic element 20a, the silicon substrate 20 is internally processed three times, each time at a different depth, so that in terms of the thickness direction of the silicon substrate 20, three internal cracks 22 are formed in alignment, as shown in FIG. 32(c), whereas when forming the groups of internal cracks 12 along the intended splitting line C1, which is parallel to the longer edges of the logic element 20a, the silicon substrate 20 is internally processed four times, each time at a different depth, as shown in FIG. 32(b) Therefore, it takes more time to internally process the silicon substrate 20 along the intended splitting line C1, which is parallel to the longer edges of the logic element 20a. But, the comprehensive length of the unprocessed portions of the silicon substrate 20 as seen in FIG. 32(b), which is a sectional view of the silicon substrate 20 at a line A—A in FIG. 32(a), which is parallel to the longer edges of the logic element 20a, becomes smaller than the comprehensive length of the unprocessed portions of the silicon substrate 20 as seen in FIG. 32(c), which is a sectional view of the silicon substrate 20 at a line B—B in FIG. 32(a). Therefore, when splitting the silicon substrate 20 along the intended splitting line C1 parallel to the longer edges of the logic element 20a, the silicon substrate 20 can be split with the application of a smaller amount of external force than when splitting the silicon substrate 20 along the intended splitting line C2 parallel to the shorter edges of the logic element 20a. In other words, this method of internally processing the silicon substrate 20 makes it possible to precisely split the silicon substrate 20.

As described above, according to this method, the number of internal cracks to be formed, in terms of the thickness direction of the silicon substrate 20 (direction intersectional to primary surface of substrate), is determined according to the direction of the intended splitting line so that the overall length of the portions of the silicon substrate 20 which will be left unprocessed in terms of the thickness direction of the silicon substrate 20 when the silicon substrate 20 is internally processed in the direction parallel to the longer edges of the logic element 20a will become smaller. Therefore, this method reduces the amount by which the logic elements 20 are damaged when the silicon substrate 20 is split.

Incidentally, as another means for reducing the amount of force to be applied to split the silicon substrate 20 along the intended splitting line parallel to the longer edges of the logic element 20, the overall length by which the silicon substrate 20 is left unprocessed in terms of the direction in which the silicon substrate 20 is scanned by the beam of laser light for the formation of the internal cracks may be reduced, or the overall length by which the silicon substrate 20 is left unprocessed may be reduced in both the above-mentioned thickness direction and the scanning direction. In order to do so, each group of internal cracks is to be modified in its position in terms of the thickness direction of the silicon substrate 20, length of each crack, crack density in terms of the direction in which the beam of laser light is moved, etc., according to the direction of the intended splitting line.

For example, it is possible to set the position of the light convergence point so that after the internal processing of the silicon substrate 20 in the direction parallel to the longer edges of the logic element 20a, the group of internal cracks closest to the top surface 21 of the silicon substrate 20, across which the plurality of logic elements 20a are present, will be as close as possible to the top surface 21 without reaching it. When processing the silicon substrate 20 in the direction parallel to the longer edges of the logic element 20a, the beam of laser light is desired to be moved at a lower speed than the speed at which the silicon substrate 20 is processed in the direction parallel to the shorter edges of the logic element 20a, in consideration of the minute vertical movement of the stage, which occurs as the silicon substrate 20 is scanned by the beam of laser light.

Further, the growth in length of each internal crack in the group of internal cracks aligned in the direction parallel to the longer edges of the logic element 20a can be enhanced by internally processing the silicon substrate 20 while maintaining a large degree of temperature gradient between the top and bottom surfaces of the silicon substrate 20 by cooling the bottom surface of the silicon substrate 20.

Further, as another means for forming the group of internal cracks at a higher density in the direction parallel to the longer edges of the logic element 20a, it is possible to increase the frequency with which the silicon substrate 20 is processed by a beam of laser light, or reduce the speed at which a beam of laser light is moved.

(Embodiment 4)

Figure 33:
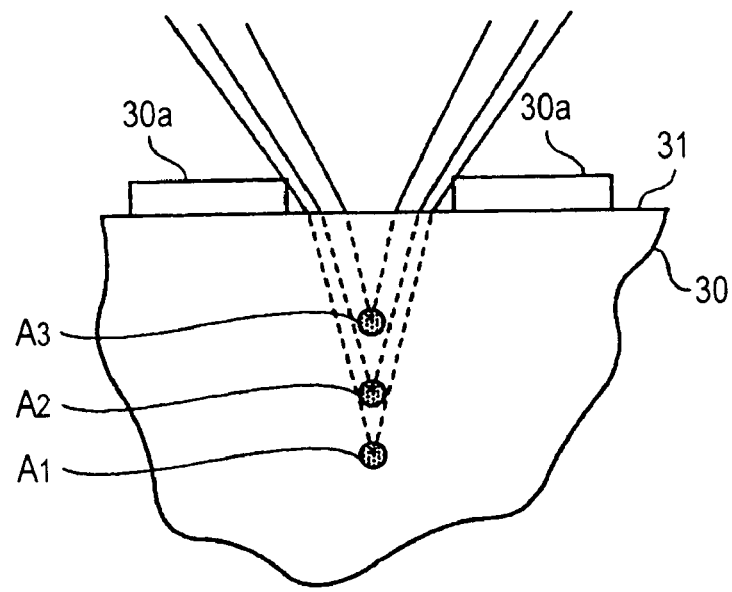
FIG. 33 is a schematic drawing for describing the fourth embodiment of the present invention, FIG. 33(a) showing a plurality of internal points of the substrate, which are different in depth, and to which a plurality of secondary beams of laser light, which are formed by splitting the primary beam of laser light are made to converge, and FIGS. 33(b) and 33(c) depicting the optical system for causing the beam of laser light to converge.
Figure 33:
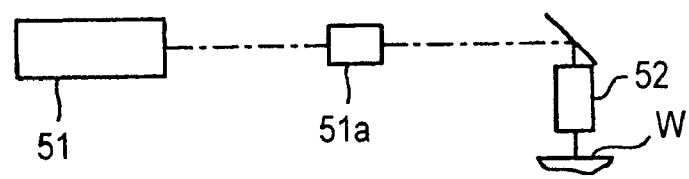
Figure 33:
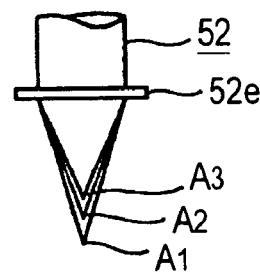

Referring to FIG. 33(a), in this embodiment, the silicon substrate 30 having a plurality of logic elements 30 is internally processed with a beam of laser light so that a plurality of groups of internal cracks, which are in alignment with the same intended splitting line, different in the distance (depth) from the top surface 31, and different in the length of the internal crack, are formed by a single scanning of the silicon substrate 30 by the beam of laser light. Thus, the light converging optical system 52 of the apparatus shown in FIG. 14 employs an optical element which causes a beam of laser light to converge to three different points A1, A2, and A3. More specifically, referring to FIG. 33(b), the light converging optical system 52, has the optical element for causing a beam of laser light to converge to a plurality of points on its optical axis. As the methods for causing a beam of laser light to converge to a plurality of points, there are the amplitude division method and wave surface division method. Some of the amplitude division methods employ a beam splitter or the like. In this embodiment, however, a diffraction optical element 52e shown in FIG. 33(c) is used.

The diffraction optical element 52e can be adjusted in its surface shape to create various wave surfaces. A pattern which causes a beam of laser light to converge to a plurality of points is calculated, and the surface shape in accordance with the calculated pattern is produced.

Figure 34:
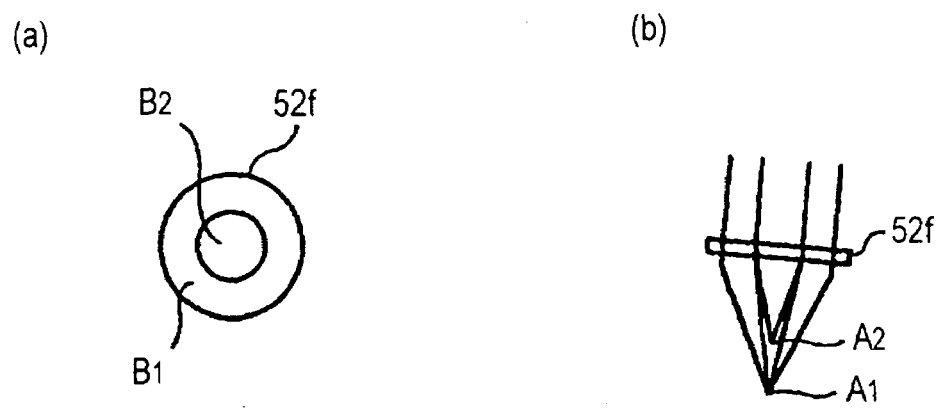
FIG. 34 is a schematic drawing for describing another optical system, in the fourth embodiment, for causing the beam of laser light to converge.

Instead, an optical element 52f, shown in FIG. 34, based on the wave surface division method may be employed. The light converging areas B1 and B2 are different in diffraction, being therefore different in the light convergence point: light convergence points A1 and A2, respectively. In other words, a single beam of laser light can be made to simultaneously converge to a plurality of points. Such an optical element can be realized by partially processing an optical lens, for example, by bonding to a lens another lens different in diffraction. Further, it is possible to employ a prism.

Further, it is also possible for the abovementioned diffraction optical element to be developed into an optical element, such as the optical element 52f, based on the wave surface division method.

Figure 35:
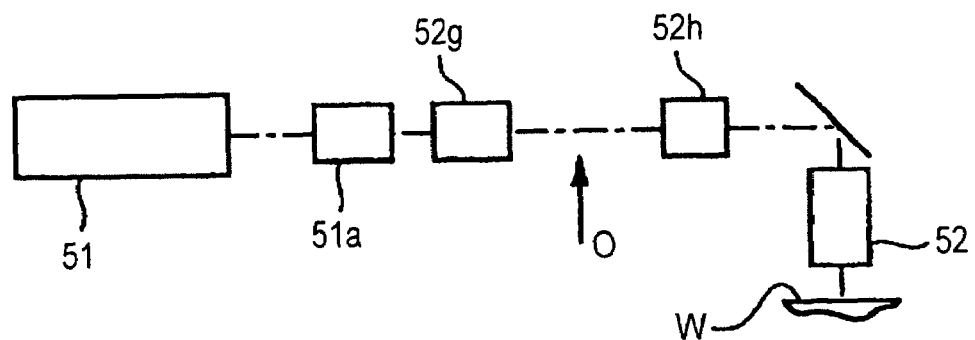
FIG. 35 is a schematic drawing for describing yet another optical system, in the fourth embodiment, for causing the beam of laser light to converge.

Instead of employing an optical element which causes a beam of laser light to converge to a plurality of points for the light converging optical system 52, it is possible to employ a combination of an optical element 52g and a relay lens 52h, shown in FIG. 35, which causes a beam of laser light to converge to a plurality of points in the adjacencies of the midpoint O between the light converging optical system 52 and a light source 51, and forms the images of the light convergence points in a workpiece W.

(Embodiment 5)

As described above, the length of the internal crack formed per light convergence point A is 2–100 μm, and the thickness of the silicon substrate 10 in which the cracks are formed is 625 μm. Therefore, in order to split the silicon substrate 10, the silicon substrate 10 must be internally processed a plural number of times, in terms of the thickness direction of the silicon substrate 10. As for the order in which a beam of laser light is converged to a plurality of points in the silicon substrate 10, in terms of the thickness direction of the silicon substrate 10, to internally process the silicon substrate 10 (silicon substrate 10 is internally processed without moving beam of laser light in parallel to top surface of silicon substrate 10 so that internal cracks align in thickness direction of silicon substrate 10), first, the beam of laser light is made to converge to the light convergence point farthest from the top surface of the silicon substrate 10 (light convergence point closest to bottom surface), then, to the light convergence point next farthest from the top surface, and so on.

Figure 36:
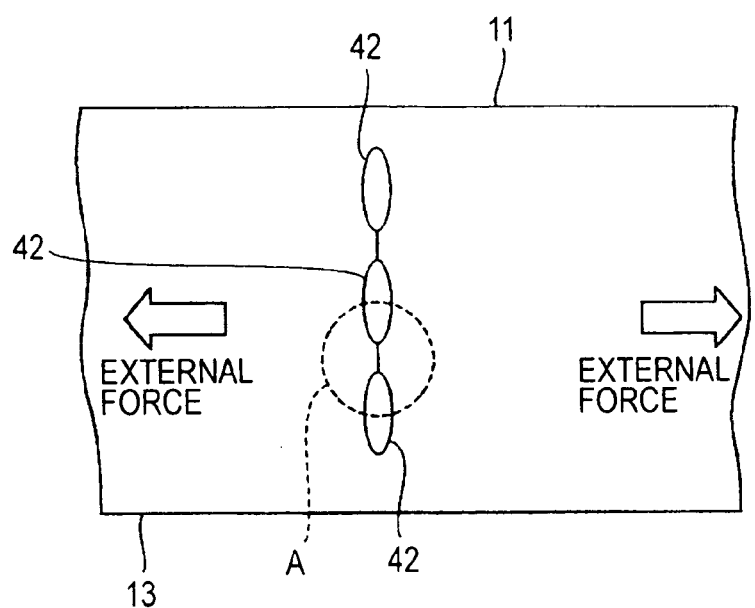
FIG. 36 is a schematic drawing of the internal cracks in the fifth embodiment of the present invention.
Figure 36:
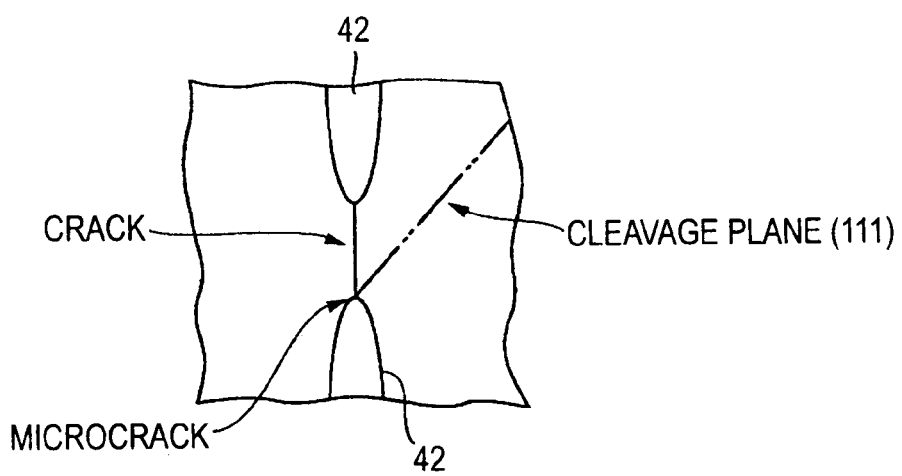

FIG. 36 is a sectional view of the internally processed portion of the silicon substrate 10, at a plane perpendicular to the primary surface of the silicon substrate 10. FIG. 36(b) is an enlarged view of the portion G in FIG. 36(a). In this case, the silicon substrate 10 is internally processed so that the interval between the adjacent two processed portions 42 will be such that allows a plurality of processed portions 42 to be deemed to be a single longer processed portion, based on the results of splitting tests. The internal processing method that internally processes the silicon substrate 10 so that after the completion of the process, a plurality of process portions 42 in alignment in the thickness direction of the silicon substrate 10 can be deemed to be a single longer processed portion means such an internal processing method that processes the silicon substrate 10 so that the crack which forms between the adjacent two processed portions 42 when splitting the silicon substrate 10 later, and connects the two portions, does not coincide with any of the cleavage planes of the crystalline silicon, which is the material for the silicon substrate 10. With the use of this method, for example, when the silicon substrate 10 is split at the point below which the two processed portions 42 which can be deemed to be a single longer processed portion, and the crack connecting the two portions 42, are present, an even longer crack, the surfaces of which are virtually flat, is formed. In other words, the silicon substrate 10 can be split so that it will yield a plurality of logic elements 10a, the secondary surfaces of which are virtually flat.

Further, as for the positional deviation of each of the processed portions 42 relative to the other processed portion, in terms of the horizontal direction (X and Y directions), that is, the direction perpendicular to the thickness direction of the silicon substrate 10 (theoretical surface which will results as silicon substrate 10 is split, and is parallel to Z direction), which occurs when processing the portions 42, the horizontal deviation of the processed portion 42 (deviation of portion 42 in horizontal direction in FIG. 36) must be within roughly □5μ. If the deviation is outside this range, the crack which is to connect the adjacent two processed portions 42 is not likely to form flat surfaces. As for the number of the portions 42 to be processed, it should be determined based on the conditions which are determined, through splitting tests, to yield flat surfaces, although the size of the surfaces which will result from the splitting of the silicon substrate 10 and the size of the internal portion to be processed must also be taken into consideration.

In this embodiment, the silicon substrate 10 is internally processed so that after the completion of the processing, there will be, below a given point of a given intended splitting line, a plurality of processed portions 42 which are in alignment in the thickness direction of the silicon substrate 10, with the presence of a gap between the adjacent two processed portions 42, and can be deemed to be a single long processed portion. Therefore, the surfaces which will result when the silicon substrate 10 is split later will be flat. Therefore, not only is it possible to prevent the problem that a component is mounted in a wrong position, but also, to minimize the damage to the silicon substrate 10.

(Embodiment 6)

If the silicon substrate 10 is internally processed a plural number times as it is in the fifth embodiment, the silicon substrate 10, or an object to be processed, becomes brittle, and sometimes unexpectedly splits between the internal processing of the silicon substrate 10 and the silicon substrate splitting process. In order to prevent such a problem, it is recommendable to leave unprocessed at least a portion between the adjacent two apparent long processed portions 33 comprising a plurality of shorter processed portions 32a.

As for the positioning of the apparent long processed portions 33, four arrangements as shown in FIGS. 37(a)–37(d) are feasible. In these cases, the silicon substrate 10 is processed, based on the knowledge obtained through the abovementioned silicon substrate splitting tests, so that the shorter processed portions 32a in each of the apparent long processed portions 33 will be positioned, with the provision of such intervals that as the silicon substrate 10 is split, the adjacent two shorter process portions 32a will be connected with such a crack that does not coincides with any of the cleavage planes of the crystalline silicon.

Figure 37:
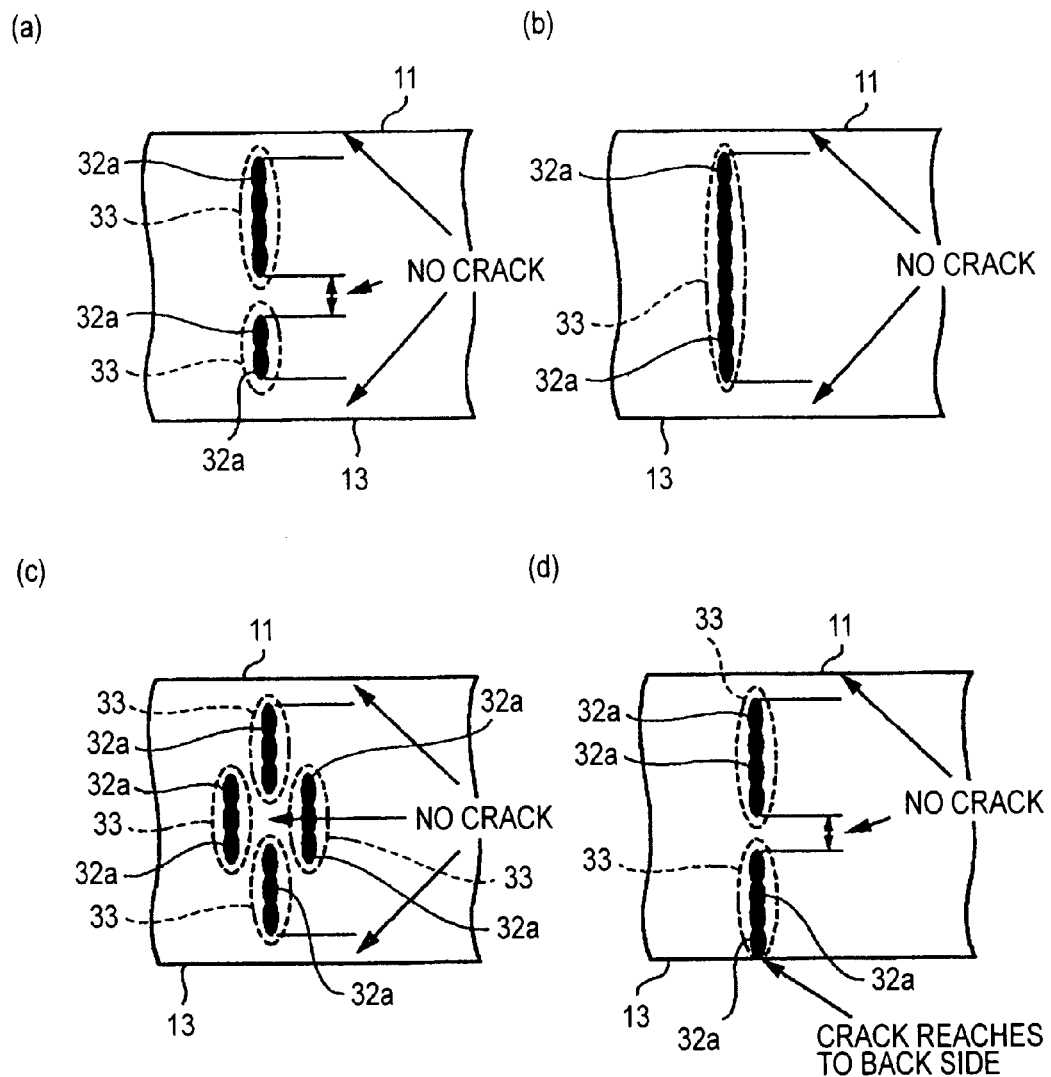
FIG. 37 is a schematic drawing of the internal cracks in the sixth embodiment of the present invention.

FIG. 37(a) shows the arrangement in which two apparent long internal cracks 33 are formed in the silicon substrate 10, in alignment in the thickness direction of the silicon substrate 10 so that there remain three unprocessed portions (portions through which crack has not been developed prior to silicon substrate splitting process), that is, the portion between the top internal crack 33 and top surface 11, the portion between the two internal cracks 33, and the portion between the bottom internal crack 33 and bottom surface 13.

FIG. 37(b) shows the arrangement in which a single apparent long internal crack 33 is formed in the silicon substrate 10 in the thickness direction of the silicon substrate 10, so that there remain two unprocessed portions, that is, the portion between the single apparent long internal crack 33 and top surface 11, and the portion between the crack 33 and bottom surface 13.

FIG. 37(c) shows the arrangement in which four apparent long internal cracks 33, that is, a pair of apparent long internal cracks 33 aligned in the thickness (depth) direction of the substrate and positioned so that unprocessed portions remain above, between, and below, and a pair of apparent long internal cracks 33 aligned in parallel in the horizontal direction and positioned on the opposite sides, one for one, of the line connecting the vertically aligned pair of cracks 33 so that the unprocessed portion between the horizontally aligned pair of internal cracks 33 functions to stop such cracks that potentially develop in the unprocessed portion between the vertically aligned pair of cracks 33 in the direction parallel to the cleavage plane of the silicon crystal.

FIG. 37(d) shows the arrangement in which two apparent long internal cracks 33 are formed in the silicon substrate 10, in alignment in the thickness direction of the silicon substrate 10, with the bottom end of the apparent long process portion 33 farther from the top surface 11 reaching the bottom surface 13. In this case, the powdery debris and the like contaminants formed as the portion of the silicon substrate 10 corresponding to the apparent long processed portion 33 on the bottom side is formed are likely to spread over the bottom surface 13. Ordinarily, however, the bottom surface of a substrate such as the one in this embodiment is covered with a dicing tape or the like pasted thereto. As a matter of fact, each of the substrates in the preceding embodiments is also covered with the dicing tape or the like. Therefore, it is thought that the powdery debris resulting from the formation of the apparent long internal crack 33 on the bottom side, which potentially spreads over the bottom surface of the silicon substrate 10, is trapped by the adhesive layer of the dicing tape, and therefore, never reaches the top surface 11, or the significant surface, of the substrate 10.

This embodiment can prevent the problem that the silicon substrate 10 is accidentally split while it is conveyed to the device for splitting it, and also, the problem that a substrate and/or an apparatus for processing it is accidentally contaminated by the extraneous substances such as the internally accumulated powdery debris resulting from the processing of the substrate.

While the invention has been described with reference to the structures disclosed herein, it is not confined to the details set forth, and this application is intended to cover such modifications or changes as may come within the purposes of the improvements or the scope of the following claims.

This application claims priority from Japanese Patent Applications Nos. 042718/2004, 042731/2004 and 335289/2004 filed Feb. 19, 2004, Feb. 19, 2004 and Nov. 19, 2004, respectively which are hereby incorporated by reference.

What is claimed is:

1. A method for manufacturing a segment from an object, said method comprising:
   a preparing step of preparing the object which has a crystalline structure;
   a surface processing step of processing the object by forming a recessed portion in a surface of the object, the recessed portion being effective to cause a stress concentration at the surface of the object;
   an internal processed-region forming step of forming an internal processed-regions at a depth of the object in a line along which a laser beam scans the surface of the object by a relative motion therebetween, the laser beam being converged adjacent the depth, wherein the thus formed internal processed-regions extend in a direction substantially perpendicular to the surface of the object; and
   an external force applying step of applying an external force to the object to form a crack between the recessed portion and the internal processed-regions, the crack extending along a non-cleavage plane of the crystalline structure.

2. A method according to claim 1, wherein the crack provides a side surface of a segment split off.

3. A method according to claim 1, wherein the crack expands from the recessed portion toward the internal processed-regions.

4. A method according to claim 1, wherein said internal processed-region forming step is carried out before said surface processing step.

5. A method according to claim 1, wherein said internal processed-region forming step is carried out after said surface processing step.

6. A method according to claim 1, wherein during said internal process-region forming step after the laser beam is converged at the depth, the laser beam is converged at another depth, thus forming internal processed-regions at a different depth, whereby, in said external force applying step, the crack extends along said non-cleavage plane of the crystalline structure to connect the internal processed-regions with each other.

* * * * *

UNITED STATES PATENT AND TRADEMARK OFFICE
CERTIFICATE OF CORRECTION

| | | |
|---|---|---|
| PATENT NO. | : 7,211,526 B2 | |
| APPLICATION NO. | : 11/058163 | |
| DATED | : May 1, 2007 | |
| INVENTOR(S) | : Junichiro Iri et al. | |

It is certified that error appears in the above-identified patent and that said Letters Patent is hereby corrected as shown below:

ON THE TITLE PAGE [57] ABSTRACT:

Line 7, "an" should be deleted.

SHEET 4:

Fig. 5, "SCRACHING" should read --SCRATCHING--.

Figure 9:
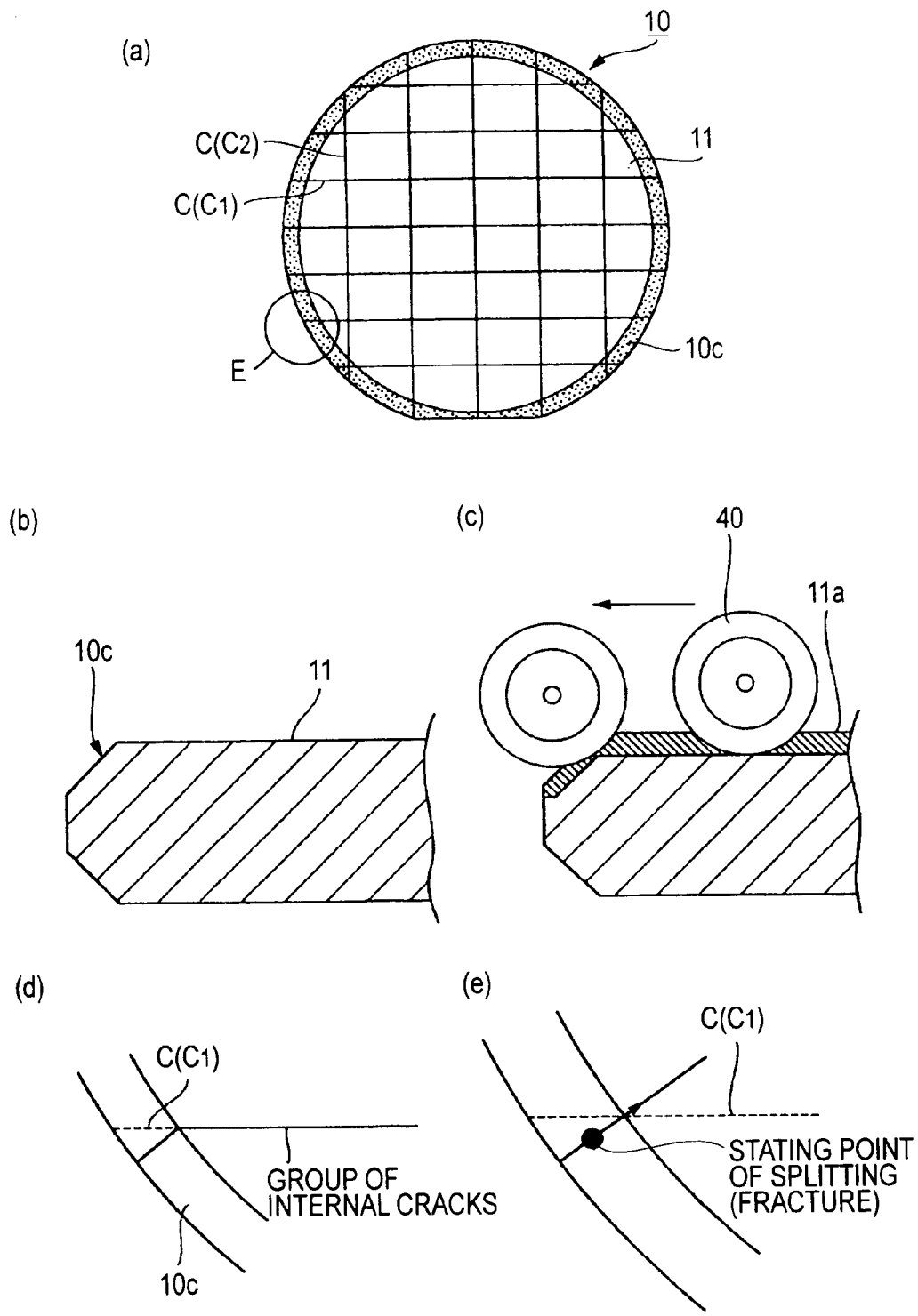
FIG. 9 is a drawing of a silicon substrate, the top edge of which has been chamfered, FIG. 9(a) being a plan view thereof, FIG. 9(b) being a sectional view thereof, at the line A—A in FIG. 9(a), FIG. 9(c) being a drawing for describing how the superficial scratch is formed across the surface resulting from the chamfering, FIG. 9(d) being an enlarged view of the portion E in FIG. 9(a), and FIG. 9(e) being a schematic drawing for describing the progression of the crack through the chamfered portion.

SHEET 7:

Fig. 9, "STATING" should read --STARTING--.

COLUMN 1:

Line 12, "slit" should read --split--.

COLUMN 7:

Line 40, "irreverent" should read --irrelevant--.

COLUMN 9:

Line 25, "tap" should read --tape--.

COLUMN 10:

Line 5, "its" should read --it--; and
Line 43, "and 8(b)" should read --and 8(b).--.

COLUMN 12:

Line 3, "groove)," should read --groove)),--.

COLUMN 13:

Line 22, "do" should read --does--; and
Line 36, "slit" should read --split--.

UNITED STATES PATENT AND TRADEMARK OFFICE
CERTIFICATE OF CORRECTION

| | |
|---|---|
| PATENT NO. | : 7,211,526 B2 |
| APPLICATION NO. | : 11/058163 |
| DATED | : May 1, 2007 |
| INVENTOR(S) | : Junichiro Iri et al. |

It is certified that error appears in the above-identified patent and that said Letters Patent is hereby corrected as shown below:

COLUMN 16:

Line 24, "measure" should read --measures--; and
    Line 65, "progresses" should read --progress--.

COLUMN 17:

Line 1, "ceases" should read --cease--.

COLUMN 18:

Line 53, "progresses" should read --progress--.

COLUMN 20:

Line 37, "a" should be deleted.

COLUMN 21:

Line 43, "satisfies" should read --satisfy--; and
    Line 54, "crack" should read --cracked--.

COLUMN 23:

Line 31, "line" should read --lines--.

COLUMN 25:

Line 19, "directing" should read --direction--.

COLUMN 29:

Line 30, "FIG. 32(b)" should read --FIG. 32(b).--.

UNITED STATES PATENT AND TRADEMARK OFFICE
CERTIFICATE OF CORRECTION

PATENT NO. : 7,211,526 B2
APPLICATION NO. : 11/058163
DATED : May 1, 2007
INVENTOR(S) : Junichiro Iri et al.

It is certified that error appears in the above-identified patent and that said Letters Patent is hereby corrected as shown below:

<u>COLUMN 32</u>:

Line 9, "results" should read --result--; and
Line 53, "coincides" should read --coincide--.

<u>COLUMN 34</u>:

Line 15, "an" (second occurrence) should be deleted; and
Line 41, "process-region" should read --processed-region--.

Signed and Sealed this

Sixteenth Day of September, 2008

JON W. DUDAS
*Director of the United States Patent and Trademark Office*